United States Patent
Yu et al.

(10) Patent No.: US 12,341,558 B2
(45) Date of Patent: Jun. 24, 2025

(54) MODULATION AND ENCODING METHOD AND APPARATUS, DEMODULATION AND DECODING METHOD AND APPARATUS, DEVICE, AND COMMUNICATION SYSTEM

(71) Applicant: Huawei Technologies Co., Ltd., Shenzhen (CN)

(72) Inventors: Fan Yu, Chengdu (CN); Zhiyu Xiao, Chengdu (CN); Weiyun Gong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 268 days.

(21) Appl. No.: 18/154,631

(22) Filed: Jan. 13, 2023

(65) Prior Publication Data

US 2023/0155680 A1     May 18, 2023

Related U.S. Application Data

(63) Continuation of application No. PCT/CN2021/100721, filed on Jun. 17, 2021.

(30) Foreign Application Priority Data

Jul. 15, 2020   (CN) .......................... 202010679255.0

(51) Int. Cl.
*H04B 10/516*   (2013.01)
*H04B 10/25*    (2013.01)
*H04L 27/34*    (2006.01)

(52) U.S. Cl.
CPC ............. *H04B 10/25* (2013.01); *H04L 27/34* (2013.01)

(58) Field of Classification Search
CPC .............................. H04B 10/25; H04B 10/516
See application file for complete search history.

(56) References Cited

U.S. PATENT DOCUMENTS 7,383,487 B2   6/2008   Shen et al.
9,941,904 B2   4/2018   Yu et al.
(Continued)

FOREIGN PATENT DOCUMENTS

CN   101119182 A   2/2008
CN   101425807 A   5/2009
(Continued)

OTHER PUBLICATIONS

Mao-Chao Lin et al:"On Block-Coded Modulation with Interblock Memory", IEEE Transactions on Communications, IEEE Service Center, Piscataway, NJ. USA, vol. 45, No., 11, Nov. 1997 (Nov. 1997), XP011009062, total 11 pages.

*Primary Examiner* — Shi K Li
(74) *Attorney, Agent, or Firm* — Slater Matsil, LLP

(57) ABSTRACT

This application discloses a modulation/demodulation and encoding/decoding method and belongs to the field of communication technologies. The modulation and encoding method includes: grading to-be-transmitted bits into a plurality of levels; encoding a plurality of levels of bits obtained through grading to obtain a plurality of levels of codewords; and mapping the plurality of levels of codewords to a symbol in a staggered manner, where the plurality of levels of codewords include a first codeword, the first codeword is located at a $Y^{th}$ level of the plurality of levels of codewords, and the first codeword overlaps at least one codeword at any level other than the $Y^{th}$ level. In this way, codewords at different levels are associated by using a symbol to which the codewords are mapped, and an overlapping part between a plurality of codewords can assist in demodulating the codewords.

18 Claims, 5 Drawing Sheets

(56) References Cited

U.S. PATENT DOCUMENTS

| | | | |
|---|---|---|---|
| 2015/0091742 A1 | 4/2015 | Ionita et al. | |
| 2016/0087649 A1* | 3/2016 | Limberg | H03M 13/356 714/776 |
| 2018/0323909 A1 | 11/2018 | Ying et al. | |
| 2019/0007092 A1* | 1/2019 | Bayesteh | H04L 1/0042 |

FOREIGN PATENT DOCUMENTS

| | | |
|---|---|---|
| CN | 102594506 A | 7/2012 |
| CN | 103503319 A | 1/2014 |
| CN | 107919941 A | 4/2018 |
| CN | 109417531 A | 3/2019 |
| EP | 2991231 A1 | 3/2016 |

\* cited by examiner

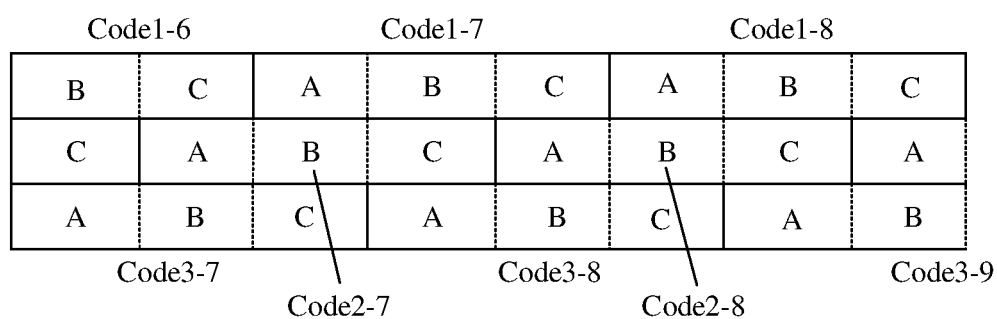
FIG. 9
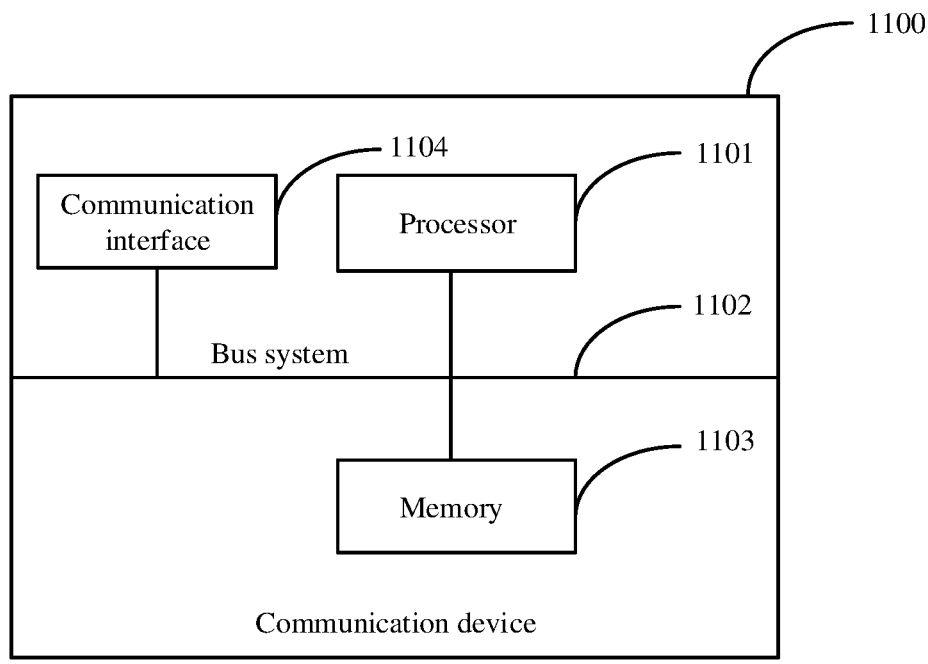
FIG. 10
FIG. 11

MODULATION AND ENCODING METHOD AND APPARATUS, DEMODULATION AND DECODING METHOD AND APPARATUS, DEVICE, AND COMMUNICATION SYSTEM

CROSS-REFERENCE TO RELATED APPLICATIONS

This application is a continuation of International Application No. PCT/CN2021/100721, filed on Jun. 17, 2021, which claims priority to Chinese Patent Application No. 202010679255.0, filed on Jul. 15, 2020. The disclosures of the aforementioned applications are hereby incorporated by reference in their entireties.

TECHNICAL FIELD

This application relates to the field of communication technologies, and in particular, to a modulation and encoding method and apparatus, a demodulation and decoding method and apparatus, a device, and a communication system.

BACKGROUND

Explosive growth of internet services drives a transmission rate of an optical transmission network line to develop from 100 Gbps to 400 Gbps and then develop to 800 Gbps or even 1 Tbps. In a next-generation higher-speed optical transmission system, to utilize bandwidth and power more effectively, higher-order modulation schemes such as 8 quadrature amplitude modulation (QAM), 16QAM, and 64QAM are used. However, a higher modulation order results in a higher bit error rate and a sharp decrease in a transmission distance.

Therefore, how to effectively reduce a bit error rate and increase a transmission distance of an optical transmission system is an issue worth studying.

SUMMARY this application provides a modulation and encoding method and apparatus, a demodulation and decoding method and apparatus, a device, and a communication system, to effectively reduce a bit error rate and increase a transmission distance of an optical transmission system. The modulation and encoding method and apparatus, the demodulation and decoding method and apparatus, the device, and the communication system are as follows:

According to a first aspect, a modulation and encoding method is provided. The method includes: grading to-be-transmitted bits into a plurality of levels; encoding a plurality of levels of bits obtained through grading to obtain a plurality of levels of codewords; and mapping the plurality of levels of codewords to a symbol in a staggered manner, where the plurality of levels of codewords include a first codeword, the first codeword is located at a $Y^{th}$ level of the plurality of levels of codewords, the first codeword overlaps at least one codeword at any level other than the $Y^{th}$ level, and Y is an integer greater than or equal to 1.

The plurality of levels of codewords may be two levels of codewords, three levels of codewords, or more than three levels of codewords.

The staggered mapping means that a codeword at a specific level and a codeword at another level are mapped to a symbol in a staggered manner. The overlapping means that some bits of a codeword and some bits of at least one codeword at any other level are located in different bits of one symbol. In other words, the staggering emphasizes staggered mappings of entire codewords, and the overlapping emphasizes some bits, of codewords at different levels, that are located in one symbol.

In the solution shown in this embodiment of this application, the plurality of levels of codewords obtained through encoding are mapped to the symbol in a staggered manner, so that codewords at different levels can be associated by using a symbol to which the codewords are mapped, and decoded information of an overlapping part between a plurality of codewords can serve as priori information of the codewords and assist in demodulating the codewords. This can effectively reduce a bit error rate and increase a transmission distance of an optical transmission system while improving accuracy of demodulation and decoding.

Specifically, codewords at different levels are staggered because of the staggered mapping. In this way, two consecutive codewords at one level may be associated by using a codeword that overlaps both of the two consecutive codewords, and decoded information of the two consecutive codewords may mutually affect demodulation of the two consecutive codewords, thereby improving accuracy of demodulation and decoding, and increasing a transmission distance of an optical transmission system. In addition, the staggered mapping manner also facilitates implementation of iterative demodulation and decoding in a decoding window.

In a possible implementation, the first codeword includes M1 bits, the at least one codeword at any level other than the $Y^{th}$ level includes M2 bits, and the overlapping means: N bits of the first codeword and N bits of the at least one codeword are respectively mapped to different bits of one symbol, where M1, M2, and N are all positive integers, N<M1, and N<M2.

For example, the at least one codeword at any level other than the $Y^{th}$ level may be referred to as a second codeword. The first codeword has a total of M1 bits, and the second codeword has a total of M2 bits. N bits of the M1 bits of the first codeword overlap N bits of the M2 bits of the second codeword, and the N bits of the first codeword and the N bits of the second codeword are respectively mapped to different bits of one symbol. That is, the first codeword partially overlaps the second codeword, and bits of an overlapping part are mapped to different bits of one symbol.

In a possible implementation, when the first codeword is not the $1^{st}$ codeword and is not the last codeword, the first codeword overlaps two consecutive codewords at any level other than the $Y^{th}$ level.

In the solution shown in this embodiment of this application, when the first codeword is not the $1^{st}$ codeword and is not the last codeword, the first codeword at the $Y^{th}$ level overlaps two consecutive codewords at any level other than the $Y^{th}$ level. In this way, the two consecutive codewords are associated by using the first codeword, so that decoded information of the two consecutive codewords can mutually affect demodulation of the two consecutive codewords, thereby improving accuracy of demodulation and decoding, and increasing a transmission distance of an optical transmission system.

In a possible implementation, the N bits of the first codeword include at least a first part and a second part, the first part overlaps some bits of a codeword at a $Z^{th}$ level other than the $Y^{th}$ level, the second part overlaps some bits of another codeword at the $Z^{th}$ level other than the $Y^{th}$ level, Z is an integer greater than or equal to 1, and Z is not equal to Y.

In a possible implementation, the N bits of the first codeword include at least a first part and a second part, and the first part overlaps at least one codeword at each level other than the $Y^{th}$ level, and/or the second part overlaps at least one codeword at each level other than the $Y^{th}$ level.

In a possible implementation, the plurality of levels of bits are X levels of bits, X is an integer greater than 1, and before the encoding the plurality of levels of bits obtained through grading, the method further includes: precoding any X−1 levels of bits in the X levels of bits to obtain X−1 precoded codewords, where the X−1 precoded codewords are the $1^{st}$ codewords corresponding to the X−1 levels of bits respectively, and lengths of the precoded codewords are different and each are less than a total length of a codeword at a corresponding level.

In the solution shown in this embodiment of this application, to achieve an objective of staggered mapping, before the X levels of bits are formally encoded, any X−1 levels of bits in the X levels of bits may be precoded to obtain X−1 precoded codewords. Lengths of the X−1 precoded codewords are different and each are less than a total length of a codeword at a corresponding level, and the X−1 precoded codewords each are the $1^{st}$ codeword at a corresponding level. Therefore, codewords subsequently obtained by formally encoding the plurality of levels of codewords are staggered, thereby helping map the plurality of levels of codewords to the symbol in a staggered manner.

In a possible implementation, the encoding the plurality of levels of bits obtained through grading includes: encoding, by using codewords with different error correction performance, the plurality of levels of bits obtained through grading, where a codeword with higher error correction performance is used for a bit at a level corresponding to a higher bit error rate.

In the solution shown in this embodiment of this application, bits at different levels are encoded by using codewords with different error correction performance. For example, a codeword with higher error correction performance is used for a bit corresponding to a higher bit error rate, thereby helping implement overall performance optimization.

It should be noted that not all levels of the plurality of levels of bits obtained through grading need to be encoded. For example, in a scenario in which a requirement for a bit error rate is not high, an encoder may not encode a bit at a level originally corresponding to a low bit error rate, thereby saving processing resources.

In a possible implementation, before the encoding the plurality of levels of bits obtained through grading, the method further includes: performing probability adaptation and shaping on unencoded bits.

In the solution shown in this embodiment of this application, a probability adaptation and shaping technology is used, so that appearance probabilities of different symbols can be different. A symbol with lower energy appears more times than a symbol with higher energy, that is, an appearance probability of a constellation point with lower energy is higher. This can reduce average transmit power, and reduce an average quantity of bits of a symbol, that is, a bit rate, thereby effectively adapting to damage caused by factors such as noise.

In a possible implementation, the mapping the plurality of levels of codewords to a symbol in a staggered manner includes: mapping, in a mapping manner of Ungerboeck partitioning (Ungerboeck partitioning), the plurality of levels of codewords to the symbol in a staggered manner.

In the solution shown in this embodiment of this application, the plurality of levels of codewords are mapped, in the mapping manner of Ungerboeck partitioning, to the symbol in a staggered manner, so that a bit error rate difference between levels can be increased, thereby facilitating hierarchical assisted demodulation.

According to a second aspect, a demodulation and decoding method is provided. The method includes: directly demodulating a first part of a first codeword, where the first codeword includes the first part and a second part; performing assisted demodulation on the second part of the first codeword based on decoded information of an overlapping part of at least one second codeword; and decoding a first codeword obtained through the direct demodulation and the assisted demodulation, where the first codeword overlaps the second codeword, and the overlapping part of the second codeword and a bit of the second part of the first codeword are mapped to different bits of one symbol.

In the solution shown in this embodiment of this application, corresponding to the modulation and encoding method provided in the first aspect, this embodiment of this application further provides a demodulation and decoding method. The demodulation and decoding method may be used to demodulate a symbol generated by using the modulation and encoding method. During demodulation, the first part of the first codeword is directly demodulated, and for the second part of the first codeword, decoded information of an overlapping part of another codeword that overlaps the second part may be used as priori information to assist in demodulating the second part of the first codeword. Therefore, accuracy of demodulation and decoding is improved, a bit error rate is effectively reduced, and a transmission distance of an optical transmission system is increased.

In a possible implementation, a symbol corresponding to the first codeword and the second codeword is obtained by mapping X levels of codewords in a staggered manner, X is an integer greater than 1, and the performing assisted demodulation on the second part of the first codeword based on decoded information of an overlapping part of at least one second codeword includes: performing assisted demodulation on the second part of the first codeword based on decoded information of an overlapping part of X−1 second codewords, where the X−1 second codewords respectively belong to different levels.

In the solution shown in this embodiment of this application, a quantity of second codewords may be related to a quantity of levels of codewords included in a symbol corresponding to the second codeword. For example, the quantity of second codewords is equal to the quantity X of levels of codewords included in the symbol minus 1, and the X−1 second codewords respectively belong to different levels.

In a possible implementation, the second part of the first codeword includes a plurality of subparts, and all bits of an overlapping part of each second codeword overlap all bits of at least one subpart; and the performing assisted demodulation on the second part of the first codeword based on decoded information of an overlapping part of at least one second codeword includes: determining a target part, of each second codeword, that overlaps any one of the plurality of subparts, and performing assisted demodulation on the subpart based on decoded information of the target part, where the target part is all bits or some bits of an overlapping part of each second codeword, and all bits of the target part overlap all bits of the corresponding subpart.

In the solution shown in this embodiment of this application, when the overlapping part of the second codeword is used to assist in demodulating the second part of the first codeword, for each overlapping part, decoded information of the overlapping part is used to assist in demodulating the second part, of the first codeword, that completely overlaps the overlapping part, or a subpart of the second part.

For example, the second part of the first codeword includes one subpart, that is, the second part is an entirety, the quantity of second codewords is 1, and all bits of the overlapping part of the second codeword overlap all bits of the second part of the first codeword. In this case, assisted demodulation is performed on the second part based on decoded information of the overlapping part, of the second codeword, that overlaps the second part.

For example, the second part of the first codeword includes a first subpart and a second subpart, the second subpart is located between the first subpart and the first part of the first codeword, the quantity of second codewords is 2, all bits of an overlapping part of one second codeword overlap all bits of the first subpart, an overlapping part of the other second codeword includes a first target part and a second target part, all bits of the first target part overlap all bits of the first subpart, and all bits of the second target part overlap all bits of the second subpart. Assisted demodulation is performed on the first subpart based on decoded information of overlapping bits between the two second codewords and the first subpart. Assisted demodulation is performed on the second subpart based on decoded information of overlapping bits between the two second codewords and the second subpart.

In a possible implementation, after the decoding a first codeword obtained through the direct demodulation and the assisted demodulation, the method further includes: outputting decoded information of the first codeword.

In the solution shown in this embodiment of this application, after the decoded information of the first codeword is obtained, the decoded information of the first codeword may be directly output.

In a possible implementation, after the decoding a first codeword obtained through the direct demodulation and the assisted demodulation, the method further includes: in a decoding window and according to a forward order, for any codeword, performing assisted demodulation on the any codeword based on decoded information of a codeword part that overlaps the any codeword; decoding any codeword obtained through demodulation, and updating decoded information of the any codeword; and outputting decoded information of a target codeword in the decoding window.

The forward order is opposite to a codeword receiving order. The decoding window includes the first codeword and the target codeword. The first codeword is the last complete codeword received in the decoding window, and the target codeword is the $1^{st}$ complete codeword received in the decoding window.

The foregoing decoding manner in the decoding window may be referred to as forward demodulation and decoding.

In the solution shown in this embodiment of this application, after the decoded information of the first codeword is obtained, the decoded information of the first codeword may alternatively not be output first. Instead, in the decoding window including the first codeword and according to the forward order, for any codeword, assisted demodulation is performed on the codeword based on decoded information of a codeword part that overlaps the codeword. After the decoded information of the target codeword in the decoding window is obtained through decoding, the decoded information of the target codeword may be output.

With the forward demodulation and decoding in the decoding window, two consecutive codewords at one level are associated, and decoded information of the two consecutive codewords may mutually affect demodulation of the two consecutive codewords, thereby improving accuracy of demodulation and decoding, and increasing a transmission distance of an optical transmission system.

In a possible implementation, the method further includes: in the decoding window and according to a backward order, for any codeword, performing assisted demodulation on the any codeword based on decoded information of a codeword part that overlaps the any codeword; and decoding any codeword obtained through demodulation, and updating decoded information of the any codeword, where the backward order is the same as the codeword receiving order.

The foregoing decoding manner in the decoding window may be referred to as backward demodulation and decoding.

In the solution shown in this embodiment of this application, with the backward demodulation and decoding in the decoding window, two consecutive codewords at one level are associated, and decoded information of the two consecutive codewords may mutually affect demodulation of the two consecutive codewords, thereby improving accuracy of demodulation and decoding of each codeword, and increasing a transmission distance of an optical transmission system.

In addition, backward demodulation and decoding may be combined with forward demodulation and decoding to implement iterative decoding in the decoding window, so that decoded information obtained through decoding is more accurate. For example, in the decoding window, backward demodulation and decoding may be performed first, then forward demodulation and decoding is performed (in this case, decoded information of the target codeword is not output), then backward demodulation and decoding is performed, and then forward demodulation and decoding is performed. The foregoing process is repeated until a target quantity of iterations is reached. Then decoded information of the target codeword is output.

According to a third aspect, a modulation and encoding apparatus is provided. The apparatus includes:
  a grading unit, configured to grade to-be-transmitted bits into a plurality of levels;
  an encoder, configured to encode a plurality of levels of bits obtained through grading to obtain a plurality of levels of codewords; and
  a mapping unit, configured to map the plurality of levels of codewords to a symbol in a staggered manner, where the plurality of levels of codewords include a first codeword, the first codeword is located at a $Y^{th}$ level of the plurality of levels of codewords, the first codeword overlaps at least one codeword at any level other than the $Y^{th}$ level, and Y is an integer greater than or equal to 1.

In a possible implementation, the first codeword includes M1 bits, the at least one codeword at any level other than the $Y^{th}$ level includes M2 bits, and the overlapping means: N bits of the first codeword and N bits of the at least one codeword are respectively mapped to different bits of one symbol, where M1, M2, and N are all positive integers, N<M1, and N<M2.

In a possible implementation, when the first codeword is not the $1^{st}$ codeword and is not the last codeword, the first codeword overlaps two consecutive codewords at any level other than the $Y^{th}$ level.

In a possible implementation, the N bits of the first codeword include at least a first part and a second part, the first part overlaps some bits of a codeword at a $Z^{th}$ level, the second part overlaps some bits of another codeword at the $Z^{th}$ level, Z is an integer greater than or equal to 1, and Z is not equal to Y.

In a possible implementation, the N bits of the first codeword include at least a first part and a second part, and the first part overlaps at least one codeword at each level other than the $Y^{th}$ level, and/or the second part overlaps at least one codeword at each level other than the $Y^{th}$ level.

In a possible implementation, the plurality of levels of bits are X levels of bits, X is an integer greater than 1, and before encoding the plurality of levels of bits obtained through grading, the encoder is further configured to: precode any X−1 levels of bits in the X levels of bits to obtain X−1 precoded codewords, where the X−1 precoded codewords are the $1^{st}$ codewords corresponding to the X−1 levels of bits respectively, and lengths of the precoded codewords are different and each are less than a total length of a codeword at a corresponding level.

In a possible implementation, when encoding the plurality of levels of bits obtained through grading, the encoder is configured to: encode, by using codewords with different error correction performance, the plurality of levels of bits obtained through grading, where a codeword with higher error correction performance is used for a bit at a level corresponding to a higher bit error rate.

In a possible implementation, the apparatus further includes a probability adapter, configured to: perform probability adaptation and shaping on unencoded bits.

In a possible implementation, the mapping unit is configured to: map, in a mapping manner of Ungerboeck partitioning, the plurality of levels of codewords to the symbol in a staggered manner.

According to a fourth aspect, a demodulation and decoding apparatus is provided. The apparatus includes:

a demapping unit, configured to directly demodulate a first part of a first codeword, where the first codeword includes the first part and a second part, where the demapping unit is further configured to perform assisted demodulation on the second part of the first codeword based on decoded information of an overlapping part of at least one second codeword; and a decoder, configured to decode a first codeword obtained through the direct demodulation and the assisted demodulation, where the first codeword overlaps the second codeword, and the overlapping part of the second codeword and a bit of the second part of the first codeword are mapped to different bits of one symbol.

In a possible implementation, a symbol corresponding to the first codeword and the second codeword is obtained by mapping X levels of codewords in a staggered manner, X is an integer greater than 1, and the demapping unit is configured to: perform assisted demodulation on the second part of the first codeword based on decoded information of an overlapping part of X−1 second codewords, where the X−1 second codewords respectively belong to different levels.

In a possible implementation, the second part of the first codeword includes a plurality of subparts, all bits of an overlapping part of each second codeword overlap all bits of at least one subpart, and the demapping unit is configured to: determine a target part, of each second codeword, that overlaps any one of the plurality of subparts, and perform assisted demodulation on each subpart based on decoded information of the target part, where the target part is all bits or some bits of an overlapping part of each second codeword, and all bits of the target part overlap all bits of the corresponding subpart.

In a possible implementation, the second part of the first codeword includes a first subpart and a second subpart, and the second subpart is located between the first subpart and the first part of the first codeword; the quantity of second codewords is 2, all bits of an overlapping part of one of the two second codewords overlap all bits of the first subpart, an overlapping part of the other second codeword includes a first target part and a second target part, all bits of the first target part overlap all bits of the first subpart, and all bits of the second target part overlap all bits of the second subpart; and the demapping unit is configured to: perform assisted demodulation on the first subpart based on decoded information of the overlapping part, of one second codeword, that overlaps the first subpart, and decoded information of the first target part of the other second codeword; and is further configured to: perform assisted demodulation on the second subpart based on decoded information of the second target part, of the other second codeword, that overlaps the second subpart.

In a possible implementation, the decoder is further configured to: output decoded information of the first codeword.

In a possible implementation, the demapping unit is further configured to: in a decoding window and according to a forward order, for any codeword, perform assisted demodulation on the any codeword based on decoded information of a codeword part that overlaps the any codeword; and the decoder is further configured to: decode any codeword obtained through demodulation, and update decoded information of the any codeword; and output decoded information of a target codeword in the decoding window, where the forward order is opposite to a codeword receiving order, and the target codeword is the $1^{st}$ codeword received in the decoding window.

In a possible implementation, the demapping unit is further configured to: in the decoding window and according to a backward order, for any codeword, perform assisted demodulation on the any codeword based on decoded information of a codeword part that overlaps the any codeword; and the decoder is further configured to: decode any codeword obtained through demodulation, and update decoded information of the any codeword, where the backward order is the same as the codeword receiving order.

According to a fifth aspect, a communication device is provided. The communication device includes a memory and a processor, where the memory is configured to store a computer program; and when the processor runs the computer program in the memory, the processor performs the modulation and encoding method according to any one of the implementations of the first aspect.

According to a sixth aspect, a communication device is provided. The communication device includes a memory and a processor, where the memory is configured to store a computer program; and when the processor runs the computer program in the memory, the processor performs the demodulation and decoding method according to any one of the implementations of the second aspect.

According to a seventh aspect, a communication system is provided. The communication system includes at least one communication device according to the fifth aspect, and/or at least one communication device according to the sixth aspect.

According to an eighth aspect, a computer-readable storage medium is provided, including instructions. When the instructions in the computer-readable storage medium are executed by a communication device, the communication device performs the method according to the first aspect or the second aspect.

According to a ninth aspect, a computer program product including instructions is provided. When the computer program product runs on a communication device, the communication device performs the method according to the first aspect or the second aspect.

According to a tenth aspect, a chip is provided. The chip includes a programmable logic circuit and/or program instructions. When the chip runs, the chip is configured to implement the method according to the first aspect or the second aspect.

Technical solutions provided in embodiments of this application have the following beneficial effects:

In solutions shown in embodiments of this application, a plurality of levels of codewords obtained through encoding are mapped to a symbol in a staggered manner, so that codewords at different levels can be associated by using a symbol to which the codewords are mapped, and decoded information of an overlapping part between a plurality of codewords can serve as priori information of the codewords and assist in demodulating the codewords. This improves accuracy of demodulation and decoding, and can effectively reduce a bit error rate and increase a transmission distance of an optical transmission system.

BRIEF DESCRIPTION OF THE DRAWINGS

FIG. 9 is a diagram of a relationship between a symbol and a codeword in 64QAM according to an embodiment of this application;

FIG. 10 is a diagram of a relationship between a symbol and a codeword in 64QAM according to an embodiment of this application;

FIG. 11 is a schematic diagram of a structure of a communication device according to an embodiment of this application.

DETAILED DESCRIPTION OF ILLUSTRATIVE EMBODIMENTS

Embodiments of this application provide a modulation and encoding method and apparatus, a demodulation and decoding method and apparatus, a device, and a communication system. The communication system includes at least two communication devices that can serve as a transmit end and a receive end respectively. The modulation and encoding method may be performed by a communication device serving as a transmit end, and the demodulation and decoding method may be performed by a communication device serving as a receive end.

The following separately describes the two communication devices.

Figure 1:
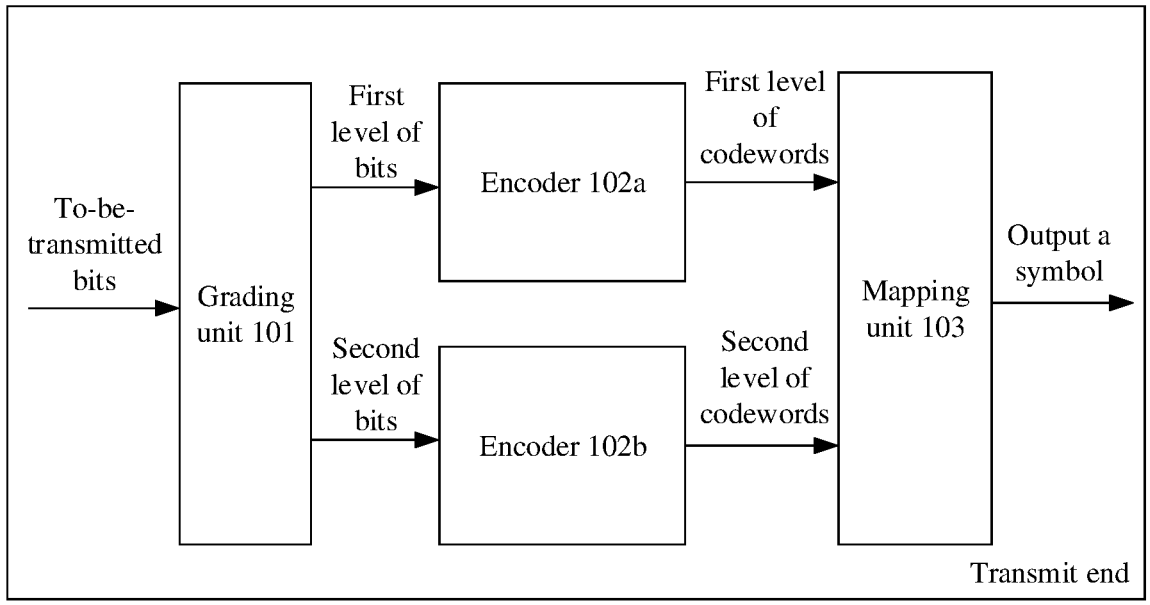
FIG. 1 is a schematic diagram of a structure of a communication device serving as a transmit end according to an embodiment of this application.

As shown in FIG. 1, the communication device serving as a transmit end includes a grading unit 101, an encoder (including an encoder 102a and an encoder 102b), and a mapping unit 103. The grading unit 101 is configured to grade to-be-transmitted bits into a plurality of levels. The encoder is configured to encode bits obtained through grading to obtain a plurality of levels of codewords. The mapping unit 103 is configured to map the plurality of levels of codewords to a symbol in a staggered manner, and output the symbol. A quantity of encoders included in the communication device may be the same as a quantity of levels of codewords obtained through encoding. To be specific, each encoder encodes bits at one level by using a codeword with one type of error correction performance. As shown in FIG. 1, the communication device includes two encoders: the encoder 102a and the encoder 102b. In this case, the communication device may obtain two levels of codewords through encoding. It should be noted that, in a specific case, the encoder may not encode bits at a specific level. For example, in a scenario in which a requirement for a bit error rate is not high, an encoder may not encode a bit at a level originally corresponding to a low bit error rate, thereby saving processing resources.

Figure 2:
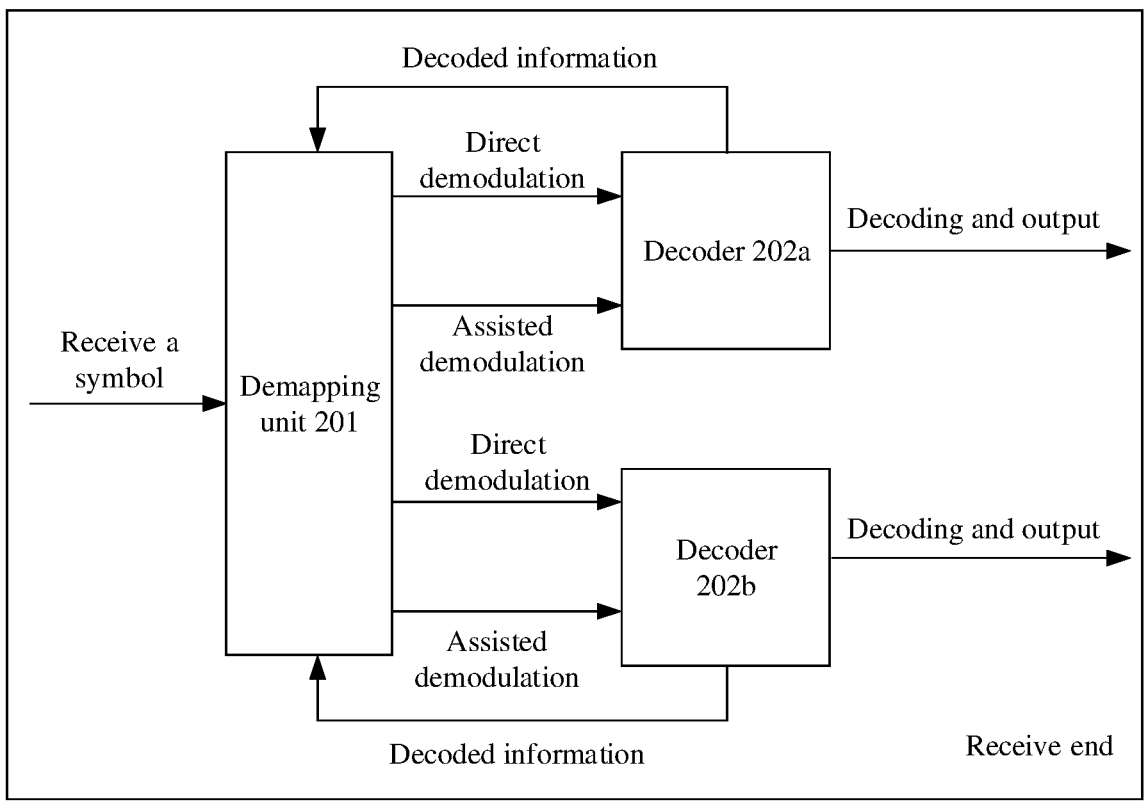
FIG. 2 is a schematic diagram of a structure of a communication device serving as a receive end according to an embodiment of this application.

As shown in FIG. 2, the communication device serving as a receive end includes a demapping unit 201 and a decoder (including a decoder 202a and a decoder 202b). The demapping unit 201 is configured to demodulate a received codeword. For example, for a received codeword, the demapping unit 201 is configured to directly demodulate a codeword part of the codeword, and perform assisted demodulation on a remaining codeword part of the codeword based on decoded information output by the decoder. The decoder is configured to receive a codeword demodulated by the demapping unit, decode the demodulated codeword, and further output the decoded information to the demapping unit, so that the demapping unit performs assisted demodulation based on the decoded information. It should be noted that, if a codeword at a specific level has not been encoded at the transmit end, correspondingly, the decoder at the receive end does not perform decoding processing on the codeword at the level after receiving the codeword. A quantity of decoders included in the communication device may be the same as a quantity of levels of received codewords. To be specific, each decoder decodes one level of received codewords. As shown in FIG. 2, the communication device includes two decoders: the decoder 202a and the decoder 202b. In this case, the communication device may decode two levels of codewords.

It should be noted that the two communication devices included in the communication system are interchangeable. To be specific, the communication device serving as a transmit end may alternatively serve as a receive end to receive a signal, and the communication device serving as a receive end may alternatively serve as a transmit end to send a signal. In this case, the communication device should have the foregoing two structures of a transmit end and a receive end.

For ease of understanding this application, the following describes an application scenario of this application.

Explosive growth of internet services drives a transmission rate of an optical transmission network line to develop from 100 Gbps to 400 Gbps and then develop to 800 Gbps or 1 Tbps. In a next-generation higher-speed system, to utilize bandwidth and power more effectively, higher-order modulation schemes such as 8 quadrature amplitude modulation (QAM), 16QAM, and 64QAM are used. However, a higher modulation order results in higher bit error rate and a sharp decrease in a transmission distance.

A forward error correction (FEC) code with a strong error correction capability can make up for a deficiency of a signal-to-noise ratio (SNR) of a system. With continuous iterative development of the FEC in recent 10 years, performance of the FEC is increasingly close to a Shannon limit, and a possibility of improving performance only based on the FEC is increasingly low, or in other words, costs are increasingly high. Therefore, a modulation and encoding technology designed by combining higher-order modulation and FEC encoding becomes a key technology for a high-speed optical system. The modulation and encoding technology can improve channel spectrum utilization to approach a Shannon channel capacity.

A main modulation and encoding technology in a related technology includes multi-level coding (MLC). The MLC is an efficient encoding and modulation scheme in which signal bandwidth is not increased and an effective data rate is not reduced, thereby effectively improving data transmission performance.

Bit error rates of different bits in a symbol are different due to mapping in higher-order modulation. For example, in 16QAM Gray mapping, a bit error rate of a least significant bit b1b3 is twice that of a most significant bit b2b4. A core idea of the MLC is to protect different information bits by using codewords with different error correction performance to implement overall performance optimization. FEC code with a low bit rate and a higher error correction capability is used to protect a least significant bit prone to an error. For a most significant bit, because there is a large Euclidean distance between most significant bits, FEC code with a high bit rate and a lower error correction capability is used for protection.

In a related technology, there are currently two encoding schemes for each level of component codes of the MLC. In a scheme 1, a soft decision forward error correction (SD FEC) code, for example, a low-density parity-check (LDPC) code or a turbo code, is used. In a scheme 2, a hard decision forward error correction (HD FEC) code, for example, a Reed-Solomon code (RS) or a BCH code, is used. In the scheme 1, because the SD FEC is used for encoding and decoding at each level, implementation complexity is quite high. Especially in the case of application in a high-speed optical transmission system, overheads of the FEC are greatly limited. In this case, overheads allocated to FEC code that has a high bit rate and that is used to protect a most significant bit are quite small, and correspondingly, complexity of the SD FEC is quite high. In addition, a throughput is high. As a result, implementation resources of the entire system are quite large, and implementation is impossible. In the scheme 2, because the HD FEC is used for encoding and decoding at each level, gain performance is relatively low, and cannot meet a gain requirement of a high-speed optical transmission system.

In view of this, embodiments of this application provide a modulation and encoding method and a demodulation and decoding method. In the method, gain performance of modulation and encoding is further improved by combining encoding and modulation schemes.

Figure 3:
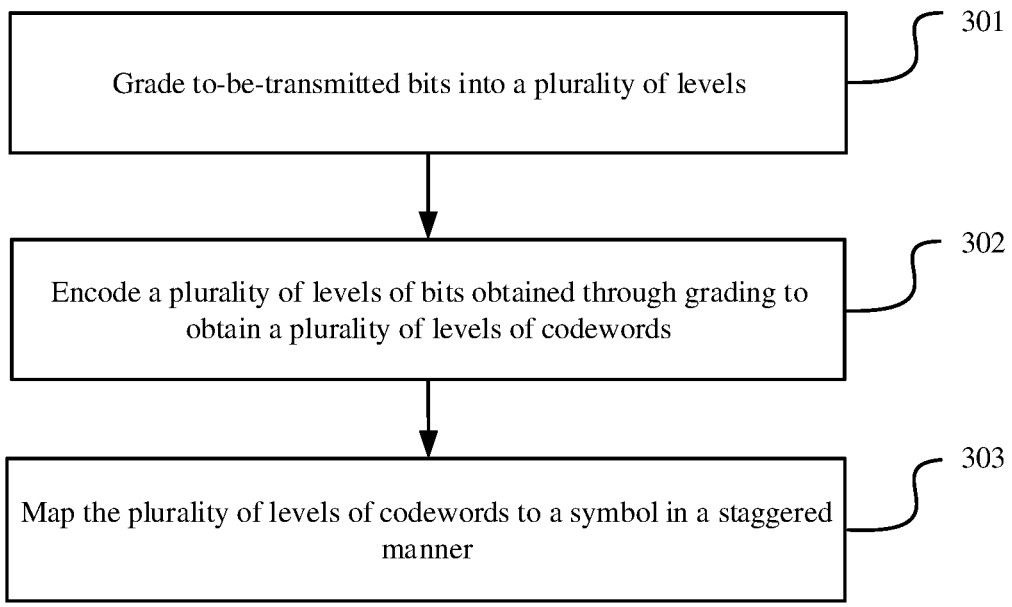
FIG. 3 is a flowchart of a modulation and encoding method according to an embodiment of this application.

FIG. 3 provides a modulation and encoding method. The modulation and encoding method may be implemented by a communication device at a transmit end. The following describes in detail a processing procedure of the method shown in FIG. 3 with reference to a specific implementation.

Step 301: Grade to-be-transmitted bits into a plurality of levels.

In the solution shown in this embodiment of this application, bit error rates of different bits in a symbol are different due to mapping in higher-order modulation. Therefore, codewords with different error correction performance may be used to respectively protect bits at different levels.

Before the to-be-transmitted bits are encoded, the to-be-transmitted bits may be first graded into a plurality of levels of bits, and then the plurality of levels of bits are encoded. The grading may also be referred to as categorization, grouping, or the like. Correspondingly, the plurality of levels of bits may also be referred to as a plurality of groups of bits, a plurality of categories of bits, or the like.

When the to-be-transmitted bits are graded, the following grading principle may be followed:

A core of multi-level coding is to separately protect bits with different bit error rates. Therefore, a quantity of levels into which the to-be-transmitted bits are to be graded may be determined based on a quantity of bit error rates corresponding to all bits in a symbol. To be specific, the to-be-transmitted bits are graded into levels whose quantity is the same as the quantity of bit error rates of the bits in the symbol.

After the to-be-transmitted bits are graded by using the foregoing grading principle, bit error rates corresponding to bits at each level are the same, and bit error rates corresponding to bits at different levels are different. In this way, with respect to different bit error rates, bits at different levels can be encoded by using codewords with different error correction performance.

It should be understood that a specific tolerance should be allowed in terms of bit error rates being the same or different. For example, if a bit error rate difference between two groups of bits falls within a threshold range, it may be considered that bit error rates of the two groups of bits are the same. For example, in some modulation schemes, a quantity of bit error rates corresponding to bits of a modulated symbol may be excessively large. In this case, grading may not need to be performed according to the principle of grading the to-be-transmitted bits into levels whose quantity is the same as that of bit error rates. Instead, bits corresponding to a plurality of bit error rates that are close may be graded into one level, to reduce a quantity of bit levels and prevent a quantity of levels of obtained codewords from being excessively large.

Step 302: Encode a plurality of levels of bits obtained through grading to obtain a plurality of levels of codewords.

After the to-be-transmitted bits are graded, the plurality of levels of bits obtained through grading may be encoded. In the case of encoding the plurality of levels of bits, the plurality of levels of bits obtained through grading may be encoded by using codewords with different error correction performance, so that different bits are protected by using codewords with different error correction performance, to implement overall performance optimization. For example, a codeword with higher error correction performance is used for a bit corresponding to a higher bit error rate. Usually, a codeword with higher error correction performance corresponds to larger overheads and a lower bit rate.

In the solution shown in this embodiment of this application, probability adaptation and shaping may be further combined to improve communication performance. In a possible implementation, before multi-level coding is performed on the to-be-transmitted bits, probability adaptation and shaping may be performed on unencoded bits.

In addition, to implement subsequent staggered mapping, before the plurality of levels of bits obtained through grading are formally encoded, precoding may be further performed. For example, the plurality of levels of bits are X levels of bits, where X is an integer greater than 1. To implement subsequent staggered mapping of the plurality of levels of codewords, before the plurality of levels of bits obtained through grading are formally encoded, any X−1 levels of bits in the X levels of bits may be precoded to obtain X−1 precoded codewords.

The X−1 precoded codewords are the $1^{st}$ codewords corresponding to the X−1 levels of bits respectively. Lengths of the precoded codewords are different and each are less than a total length of a codeword at a corresponding level.

Figure 5:
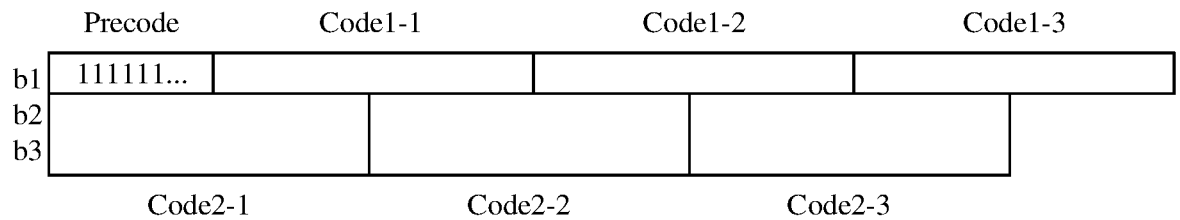
FIG. 5 is a diagram of a relationship between a symbol and a codeword in 8QAM according to an embodiment of this application.

For example, X is 2, the to-be-transmitted bits are graded into two levels, and only bits at one level need to be precoded. As shown in FIG. 5, a precode is used to represent a precoded codeword, and the precode is a code1-level codeword. A length of the precode is less than a total length of code1-level codewords. Therefore, codewords at different levels are staggered, thereby facilitating subsequent staggered mapping.

Step 303: Map the plurality of levels of codewords to a symbol in a staggered manner.

The plurality of levels of codewords include a first codeword. The first codeword is located at a $Y^{th}$ level of the plurality of levels of codewords. The first codeword overlaps at least one codeword at any level other than the $Y^{th}$ level. Y is an integer greater than or equal to 1.

Figure 6:
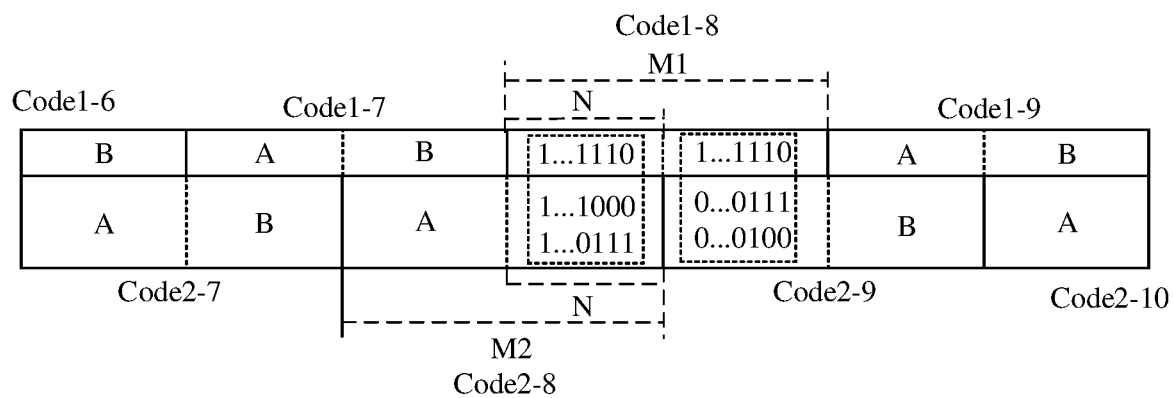
FIG. 6 is a diagram of a relationship between a symbol and a codeword in 8QAM according to an embodiment of this application.

For example, the first codeword includes M1 bits, and the at least one codeword at any level other than the $Y^{th}$ level includes M2 bits. In this case, the overlapping means: N bits of the first codeword and N bits of the at least one codeword are respectively mapped to different bits of one symbol, where M1, M2, and N are all positive integers, N<M1, and N<M2. For example, as shown in FIG. 6, a code1-8 includes M1 bits, and a code2-8 includes M2 bits. In this case, the overlapping means: N bits of the code1-8 and N bits of the code2-8 are respectively mapped to different bits of one symbol.

When the first codeword is not the $1^{st}$ codeword and is not the last codeword, the first codeword overlaps two consecutive codewords at any level other than the $Y^{th}$ level.

With the solution shown in this embodiment of this application, after the plurality of levels of bits are encoded to obtain the plurality of levels of codewords, the plurality of levels of codewords may be mapped to the symbol in a staggered manner.

In addition, during mapping, the plurality of levels of codewords may be mapped, in a mapping manner of Ungerboeck partitioning, to the symbol in a staggered manner. In this way, a difference between bit error rates can be increased, thereby facilitating hierarchical assisted demodulation.

Figure 4:
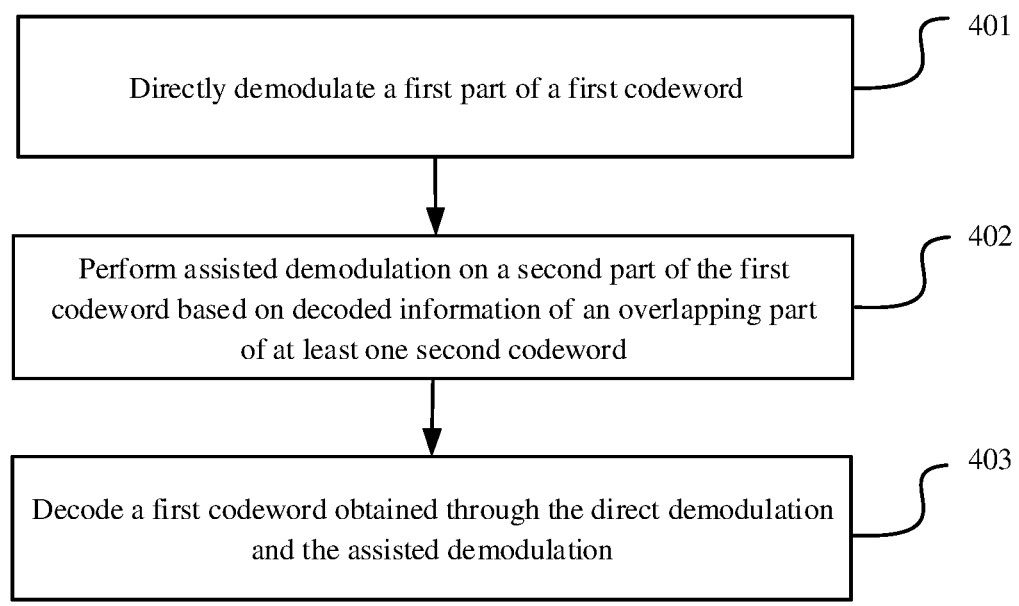
FIG. 4 is a flowchart of a demodulation and decoding method according to an embodiment of this application.

An embodiment of this application further provides a demodulation and decoding method. As shown in FIG. 4, the demodulation and decoding method may be implemented by a communication device at a receive end. The following describes in detail a processing procedure of the method with reference to a specific implementation. Content may be as follows:

Step 401: Directly demodulate a first part of a first codeword.

The first codeword includes the first part and a second part.

In the solution shown in this embodiment of this application, the first part may be a part, of the first codeword, that is newly received by the communication device, and the part may be the last part of the first codeword; and the second part may be a part, of the first codeword, that is previously received by the communication device.

Step 402: Perform assisted demodulation on the second part of the first codeword based on decoded information of an overlapping part of at least one second codeword.

The first codeword overlaps the second codeword. The overlapping part of the second codeword and a bit of the second part of the first codeword are mapped to different bits of one symbol.

Different from the direct demodulation, the assisted demodulation means demodulating, by using the decoded information of the overlapping part as priori information, a part that overlaps the overlapping part, so that demodulation and decoding performance can be improved.

A quantity of second codewords may be related to a quantity of levels of codewords included in a symbol corresponding to the first codeword and the second codeword. For example, the symbol is obtained through staggered mapping of X levels of codewords, where X is an integer greater than 1. In this case, there are a total of X−1 second codewords, and assisted demodulation is performed on the second part of the first codeword based on decoded information of an overlapping part of the X−1 second codewords.

In the X−1 second codewords, an overlapping part of some second codewords overlaps all bits of the second part of the first codeword, and an overlapping part of some second codewords overlaps some bits of the second part of the first codeword.

When the overlapping part of the second codeword is used to perform assisted demodulation on the second part of the first codeword, for each overlapping part, decoded information of the overlapping part is used to perform assisted demodulation on the second part, of the first codeword, that overlaps all bits of the overlapping part, or a subpart of the second part.

In a possible implementation, the second part of the first codeword includes one subpart, the quantity of second codewords is 1, and all bits of the overlapping part of the second codeword overlap all bits of the second part of the first codeword. In this case, assisted demodulation is performed on the second part based on decoded information of the overlapping part, of the second codeword, that overlaps the second part.

For example, as shown in FIG. 6, there are a total of two levels of codewords. The first codeword is a code1-9, and the second codeword is a code2-9. The first codeword (the code1-9) may be divided into a first part (a part B of the code1-9) and a second part (a part A of the code1-9). The second codeword (the code2-9) may be divided into an overlapping part (a part B of the code2-9) and a non-overlapping part (a part A of the code2-9: a part that does not overlap the code1-9). The second part of the first codeword (the code1-9) includes one subpart (namely, the part A of the code1-9). All bits of the overlapping part (the part B of the code2-9) of the second codeword (the code2-9) overlap all bits of the second part (the part A of the code1-9) of the first codeword (the code1-9).

During assisted demodulation, assisted demodulation is performed on the second part (the part A of the code1-9) based on decoded information of the overlapping part of the second codeword (the part B of the code2-9) that overlaps the second part (the part A of the code1-9).

In another possible implementation, the second part of the first codeword includes a plurality of subparts, and all bits of an overlapping part of each second codeword overlap all bits of at least one subpart. In this case, for each subpart of the second part of the first codeword, a target part, of each second codeword, that overlaps any one of each subpart is determined, and assisted demodulation is performed on each subpart of the second part of the first codeword based on decoded information of the target part. The target part is all bits or some bits of an overlapping part of each second codeword, and all bits of the target part overlap all bits of the corresponding subpart.

For example, as shown in FIG. 10, there are a total of three levels of codewords. The first codeword is a code1-8. The quantity of second codewords is 2, and the second codewords are a code2-8 and a code3-8. The first codeword (code10-8) may be divided into a first part (a part C of the code1-8) and a second part (parts A and B of the code1-8). The second part may be further divided into a first subpart (the part A of the code1-8) and a second subpart (the part B of the code1-8). The code2-8 may be divided into an overlapping part (a part B and a part C of the code2-8) and a non-overlapping part (a part A of the code2-8: a part that does not overlap the code1-8). The code3-8 may also be divided into an overlapping part (a part C of the code3-8) and a non-overlapping part (parts A and B of the code3-8: parts that do not overlap the code1-8). The overlapping part of the code2-8 may be further divided into a first target part (the part B of the code2-8) and a second target part (the part C of the code2-8).

All bits of the overlapping part of the code3-8 (the part C of code3-8) overlap all bits of the first subpart (the part A of the code1-8). All bits of the first target part of the overlapping part of the code2-8 (the part B of code2-8) overlap all bits of the first subpart (the part A of the code1-8). All bits of the second target part (the part C of the code2-8) overlap all bits of the second subpart (the part B of the code1-8).

In this case, during assisted demodulation, assisted demodulation is performed on the first subpart (the part A of the code1-8) based on decoded information of the overlapping part of the code3-8 (the part C of the code3-8) that overlaps the first subpart (the part A of the code1-8) and decoded information of the first target part of the code2-8 (the part B of the code2-8); and assisted demodulation is performed on the second subpart (the part B of the code1-8) based on decoded information of the second target part of the code2-8 (the part C of the code2-8) that overlaps the second subpart (the part B of the code1-8).

Step 403: Decode a first codeword obtained through the direct demodulation and the assisted demodulation.

In the solution shown in this embodiment of this application, after the first codeword is demodulated, the first codeword may be decoded. Then decoded information of the first codeword may be directly output.

To improve decoding performance, after the demodulated first codeword is decoded, in a decoding window and according to a forward order, for any codeword, assisted demodulation may be further performed on the any codeword based on decoded information of a codeword part that overlaps the any codeword. Any codeword obtained through demodulation is decoded, and decoded information of the any codeword is updated. Decoded information of a target codeword in the decoding window is output.

The decoding window is a codeword segment that includes a plurality of consecutive codewords at different levels.

The forward order is opposite to a codeword receiving order. For example, for three sequentially received codewords: a code1-7, a code1-8, and a code1-9, the forward order is an order from the code1-9 to the code1-8 and then to the code1-7.

The target codeword is the $1^{st}$ codeword received in the decoding window, and the first codeword may be the last codeword received in the decoding window. In addition, both the target codeword and the first codeword are complete codewords.

During forward decoding, in the decoding window, starting with the first codeword, assisted demodulation is sequentially performed on a next codeword in an order opposite to the receiving order, a codeword obtained through assisted demodulation is re-decoded, and decoded information is updated. Then, the decoded information of the codeword is used to assist in demodulating a next codeword, and so on, until decoded information of the last codeword (namely, the target codeword) in the decoding window is obtained. Then, the decoded information of the target codeword may be output.

In the foregoing process, decoded information of a codeword may be continuously updated, so that the decoded information is more accurate.

In a possible implementation, in the decoding window and according to a backward order, for any codeword, assisted demodulation is performed on the any codeword based on decoded information of a codeword part that overlaps the any codeword; and any codeword obtained through demodulation is decoded, and decoded information of the any codeword is updated.

The backward order is the same as the codeword receiving order. For example, for three sequentially received codewords: a code1-7, a code1-8, and a code1-9, the backward order is an order from the code1-7 to the code1-8 and then to the code1-9.

In the solution shown in this embodiment of this application, in addition to forward demodulation and decoding, backward demodulation and decoding may be further performed in the decoding window. The processing procedure of the backward demodulation and decoding is similar to that of the forward demodulation and decoding, except that directions are different. The forward demodulation and decoding starts with the first codeword and ends with the target codeword. However, the backward demodulation and decoding starts with the target codeword and ends with the first codeword.

In addition, the forward demodulation and decoding and the backward demodulation and decoding may be alternatively combined, and a plurality of iterations are performed in a manner of a plurality of times of forward demodulation and decoding and a plurality of times of backward demodulation and decoding, to further improve decoding performance.

The following describes in more detail technical solutions provided in embodiments of this application.

(1) Embodiments of this application are described by using 8QAM modulation as an example. Refer to FIG. 5 and FIG. 6.

Step 301: Grade to-be-transmitted bits into a plurality of levels.

Before the bits are encoded, the bits are graded. Each symbol in the 8QAM modulation includes three bits, and the three bits have a total of two bit error rates. In this case, the to-be-transmitted bits may be graded into two levels. As shown in FIG. 5, the symbol is represented as b1b2b3, where bit error rates of the b2 and the b3 are the same, and the b1 has another bit error rate. In this case, the to-be-transmitted bits are graded into two levels, where bits at one level are mapped to the b2 and the b3 of the symbol after being encoded by an encoder 102a, and bits at the other level are mapped to the b1 of the symbol after being encoded by an encoder 102b. In this case, a data volume of the bits at the one level is twice that of the bits at the other level.

Step 302: Encode a plurality of levels of bits obtained through grading to obtain a plurality of levels of codewords.

To implement subsequent staggered mapping, before the plurality of levels of bits obtained through grading are formally encoded, precoding may be further performed. To be specific, bits at any level in the two levels of bits are precoded to obtain a precoded codeword, where a length of the precoded codeword is less than a length of a remaining codeword in two levels of codewords, so that codewords at different levels are staggered.

As shown in FIG. 5, during precoding, code1-level bits may be precoded, for example, all are encoded into is, to obtain a precoded codeword precode, where a length of the precode is less than a length of a remaining codeword in two levels of codewords, so that codewords at the two levels are staggered. Alternatively, code2-level bits may be precoded. This is not limited in this application.

With reference to FIG. 5 and FIG. 6, two levels of codewords obtained by encoding the plurality of levels of bits obtained through grading are code1-level codewords and code2-level codewords. Codewords at each level include a plurality of codewords. The code1-level codewords include a code1-1, a code1-2, a code1-3, . . . , a code1-6, a code1-7, a code1-8, a code1-9, . . . . The code2-level codewords include a code2-1, a code2-2, a code2-3, . . . , a code2-7, a code2-8, a code2-9, a code2-10, . . . . The code1-level codewords are subsequently mapped to the b1 of the 8QAM, and the code2-level codewords are subsequently mapped to the b2 and the b3 of the 8QAM.

Step 303: Map the plurality of levels of codewords to a symbol in a staggered manner.

The plurality of levels of codewords include a first codeword. The first codeword is located at a $Y^{th}$ level of the plurality of levels of codewords. The first codeword overlaps at least one codeword at any level other than the $Y^{th}$ level. Y is an integer greater than or equal to 1.

For example, as shown in FIG. 6, the first codeword (the code1-8) includes M1 bits, and the at least one codeword (the code2-8) at any level other than the $Y^{th}$ level includes M2 bits. In this case, the overlapping means: N bits of the first codeword (the code1-8) and N bits of the at least one codeword (the code2-8) are respectively mapped to different bits of one symbol, where M1, M2, and N are all positive integers, N<M1, and N<M2.

It should be noted that, when the first codeword is not the $1^{st}$ one and is not the last one, the first codeword overlaps two consecutive codewords at any level other than the $Y^{th}$ level.

As shown in FIG. 6, for the codeword code1-8 in the code1-level codewords, some bits of the codeword code1-8 overlap some bits of the codeword code2-8 and the codeword code2-9 that are adjacent in the code2-level codewords. A dashed-line box on the left encloses overlapping bits between the code1-8 and the code2-8. A dashed-line box on the right encloses overlapping bits between the code1-8 and the code2-9. The overlapping bits are mapped to different bits of one symbol.

The plurality of levels of codewords may be mapped, in a mapping manner of Ungerboeck partitioning, to the symbol in a staggered manner. After the plurality of levels of codewords are mapped to the symbol in a staggered manner, a symbol obtained through mapping may be sent to another communication device.

Figure 7:
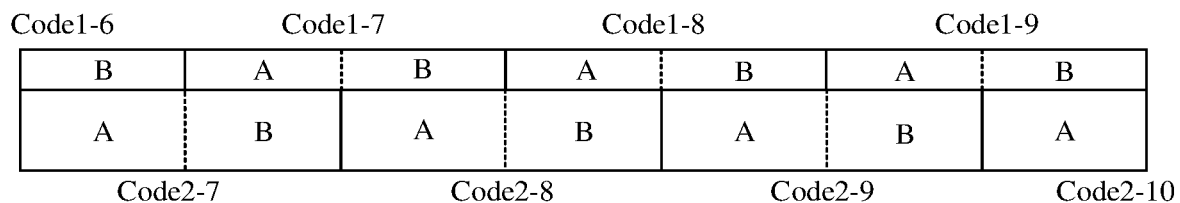
FIG. 7 is a diagram of a relationship between a symbol and a codeword in 8QAM according to an embodiment of this application.

The demodulation and decoding method provided in embodiments of this application is described below by using an example of decoding a symbol obtained through 8QAM modulation. Refer to FIG. 7.

Step 401: Directly demodulate a first part of a first codeword.

The first codeword includes the first part and a second part.

In the solution shown in this embodiment of this application, the first part may be a part, of the first codeword, that is newly received by the communication device, and the part may be the last part of the first codeword.

For example, as shown in FIG. 7, a newly arriving code block includes a part A of a code2-10 and a part B of a code1-9. The code1-9 is the first codeword, the part B of the code1-9 is the first part of the first codeword, and a part A of the code1-9 is the second part of the first codeword.

After the part B of the code1-9 is received, the part B of the code1-9 may be directly demodulated.

Step 402: Perform assisted demodulation on the second part of the first codeword based on decoded information of an overlapping part of at least one second codeword.

The first codeword overlaps the second codeword. The overlapping part of the second codeword and a bit of the second part of the first codeword are mapped to different bits of one symbol. The assisted demodulation means demodulating, by using the decoded information of the overlapping part as priori information, a part that overlaps the overlapping part, so that demodulation and decoding performance is improved.

For example, as shown in FIG. 7, a quantity of second codewords is 1, the second codeword is a code2-9, and the code2-9 and the code1-9 are staggered. The overlapping part of the second codeword is a part B of the code2-9. The part B of the code2-9 overlaps the part A of the code1-9, and decoded information of the part B of the code2-9 is used to assist in demodulating the part A of the code1-9.

Step 403: Decode a first codeword obtained through the direct demodulation and the assisted demodulation.

In the solution shown in this embodiment of this application, after demodulation of the code1-9 is completed, a demodulated code1-9 may be decoded.

After decoding is completed, decoded information of the code1-9 may be directly output. To improve decoding performance, convolutional demodulation and decoding may be alternatively used, and output is performed. To be specific, in a decoding window and according to a forward order, for any codeword, a demapping unit performs assisted demodulation on the codeword based on decoded information of a codeword part that overlaps the codeword. A decoder decodes a demodulated codeword and updates decoded information of the codeword. Then, the decoder outputs decoded information of a target codeword in the decoding window. The forward order is opposite to a codeword receiving order. The target codeword is the $1^{st}$ codeword received in the decoding window.

For example, as shown in FIG. 7, a convolutional decoding window is 7. The convolutional decoding window being 7 means that, in a decoding window including seven code blocks (for example, the part A of the code2-10 and the part B of the code1-9 constitute a code block), convolutional decoding is performed in a forward order and/or a backward order. A code2-7 is a target codeword in the decoding window, and is the 1$^{st}$ complete codeword received in the decoding window.

The following first describes forward decoding.

Decoded information of the part A of the code1-9 is used to assist in demodulating the part B of the code2-9, and decoded information of a part B of the code1-8 is used to assist in demodulating a part A of the code2-9. A demodulated code2-9 is decoded.

Decoded information of the part A of the code2-9 is used to assist in demodulating the part B of the code1-8, and decoded information of a part B of the code2-8 is used to assist in demodulating a part A of the code1-8. A demodulated code1-8 is decoded.

Decoded information of the part A of the code1-8 is used to assist in demodulating the part B of the code2-8, and decoded information of a part B of the code1-7 is used to assist in demodulating a part A of the code2-8. A demodulated code2-8 is decoded.

Decoded information of the part A of the code2-8 is used to assist in demodulating the part B of the code1-7, and decoded information of the part B of the code2-7 is used to assist in demodulating a part A of the code1-7. A demodulated code1-7 is decoded.

Decoded information of the part A of the code1-7 is used to assist in demodulating the part B of the code2-7, and decoded information of a part B of the code1-6 is used to assist in demodulating a part A of the code2-7. A demodulated code2-7 is decoded, and a decoded code2-7 is output.

In another possible implementation, a forward and backward convolutional demodulation and decoding manner may be alternatively used, and forward demodulation and decoding is combined with backward demodulation and decoding to improve decoding performance. For example, as shown in FIG. 7, a convolutional decoding window is 7.

First, backward demodulation and decoding is performed. To be specific, in a decoding window and according to a backward order, for any codeword, a demapping unit performs assisted demodulation on the codeword based on decoded information of a codeword part that overlaps the codeword. A decoder decodes a demodulated codeword and updates decoded information of the codeword. The backward order is the same as a codeword receiving order:

Decoded information of a part B of the code1-6 is used to assist in demodulating a part A of the code2-7, and decoded information of a part A of the code1-7 is used to assist in demodulating a part B of the code2-7. A demodulated code2-7 is decoded.

Decoded information of the part B of the code2-7 is used to assist in demodulating the part A of the code1-7, and decoded information of a part A of the code2-8 is used to assist in demodulating a part B of the code1-7. A demodulated code1-7 is decoded.

Decoded information of the part B of the code1-7 is used to assist in demodulating the part A of the code2-8, and decoded information of a part A of the code1-8 is used to assist in demodulating a part B of the code2-8. A demodulated code2-8 is decoded.

Decoded information of the part B of the code2-8 is used to assist in demodulating the part A of the code1-8, and decoded information of a part A of the code2-9 is used to assist in demodulating a part B of the code1-8. A demodulated code1-8 is decoded.

Decoded information of the part B of the code1-8 is used to assist in demodulating the part A of the code2-9, and decoded information of the part A of the code1-9 is used to assist in demodulating the part B of the code2-9. A demodulated code2-9 is decoded.

Decoded information of the part B of the code2-9 is used to assist in demodulating the part A of the code1-9, and the part B of the code1-9 is directly demodulated. A demodulated code1-9 is decoded. It should be noted that, in this case, decoded information of the code1-8 may be directly output; or subsequent forward demodulation and decoding may be further performed, and decoded information of a target codeword is output.

Then, forward demodulation and decoding is performed. To be specific, in the decoding window and according to a forward order, for any codeword, the demapping unit performs assisted demodulation on the codeword based on decoded information of a codeword part that overlaps the codeword. The decoder decodes a demodulated codeword and updates decoded information of the codeword. In addition, the decoder outputs decoded information of a target codeword in the decoding window:

Decoded information of the part A of the code1-9 is used to assist in demodulating the part B of the code2-9, and decoded information of a part B of the code1-8 is used to assist in demodulating a part A of the code2-9. The code2-9 is decoded.

Decoded information of the part A of the code2-9 is used to assist in demodulating the part B of the code1-8, and decoded information of the part B of the code2-8 is used to assist in demodulating the part A of the code1-8. The code1-8 is decoded.

Decoded information of the part A of the code1-8 is used to assist in demodulating the part B of the code2-8, and decoded information of a part B of the code1-7 is used to assist in demodulating a part A of the code2-8. The code2-8 is decoded.

Decoded information of the part A of the code2-8 is used to assist in demodulating the part B of the code1-7, and decoded information of a part B of the code2-7 is used to assist in demodulating a part A of the code1-7. The code1-7 is decoded.

Decoded information of the part A of the code1-7 is used to assist in demodulating the part B of the code2-7, and decoded information of a part B of the code1-6 is used to assist in demodulating a part A of the code2-7. A demodulated code2-7 is decoded, and decoded information of the code2-7 is output.

In addition, a plurality of iterations may be alternatively performed in a manner of a plurality of times of forward demodulation and decoding and a plurality of times of backward demodulation and decoding, to further improve decoding performance.

Figure 8:
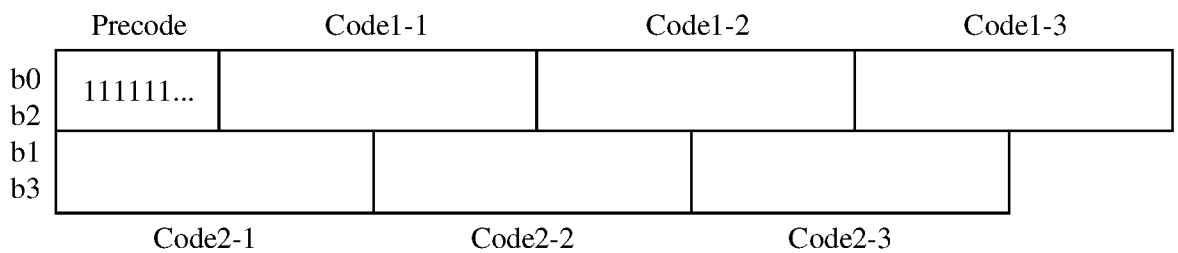
FIG. 8 is a diagram of a relationship between a symbol and a codeword in 16QAM according to an embodiment of this application.

(2) Embodiments of this application are described by using 16 QAM modulation as an example. Refer to FIG. 8.

Step 301: Grade to-be-transmitted bits into a plurality of levels.

Before the bits are encoded, the bits are graded. Each symbol in the 16QAM modulation includes four bits, and the four bits have a total of two bit error rates. In this case, the to-be-transmitted bits may be graded into two levels. As shown in FIG. 8, the symbol is represented as b3b2b1b0, where bit error rates of the b0 and the b2 are the same, and bit error rates of the b1 and the b3 are the same. In this case, the to-be-transmitted bits are graded into two levels, where one level is mapped to the b0 and the b2 of the symbol, and the other level is mapped to the b1 and the b3 of the symbol. In this case, data volumes of the two levels of bits are the same.

Step 302: Encode a plurality of levels of bits obtained through grading to obtain a plurality of levels of codewords.

To implement subsequent staggered mapping, before the plurality of levels of bits obtained through grading are formally encoded, precoding may be further performed. To be specific, bits at any level in the two levels of bits are precoded to obtain a precoded codeword, where a length of the precoded codeword is less than a length of a remaining codeword in two levels of codewords, so that codewords at different levels are staggered.

As shown in FIG. 8, code1-level bits may be precoded, for example, all are encoded into is, to obtain a precoded codeword precode, where a length of the precode is less than a length of a remaining codeword in two levels of codewords, so that codewords at the two levels are staggered. Alternatively, code2-level bits may be precoded. This is not limited in this application.

With reference to FIG. 8, two levels of codewords obtained by encoding the plurality of levels of bits obtained through grading are code1-level codewords and code2-level codewords. Codewords at each level include a plurality of codewords. The code1-level codewords include a code1-1, a code1-2, a code1-3, . . . . The code2-level codewords include a code2-1, a code2-2, a code2-3, . . . . The code1-level codewords are subsequently mapped to the b0 and the b2 of the 16QAM, and the code2-level codewords are subsequently mapped to the b1 and the b3 of the 16QAM.

Step 303: Map the plurality of levels of codewords to a symbol in a staggered manner.

The plurality of levels of codewords include a first codeword. The first codeword is located at a $Y^{th}$ level of the plurality of levels of codewords. The first codeword overlaps at least one codeword at any level other than the $Y^{th}$ level. Y is an integer greater than or equal to 1.

The plurality of levels of codewords may be mapped, in a mapping manner of Ungerboeck partitioning, to the symbol in a staggered manner. After the plurality of levels of codewords are mapped to the symbol in a staggered manner, a symbol obtained through mapping may be sent to another communication device.

The demodulation and decoding method provided in embodiments of this application is described below by using an example of decoding a symbol obtained through 16QAM modulation.

Like the 8QAM, the 16QAM modulation also includes two levels of codewords. Therefore, for a demodulation and decoding process of the 16QAM, refer to the foregoing demodulation and decoding process of the 8QAM.

(3) The modulation and encoding method provided in embodiments of this application is described by using 64QAM modulation as an example. Refer to FIG. 9 and FIG. 10.

Step 301: Grade to-be-transmitted bits into a plurality of levels.

Before the bits are encoded, the bits are graded. Each symbol in the 64QAM modulation includes six bits, and the six bits have a total of three bit error rates. In this case, the to-be-transmitted bits may be graded into three levels. As shown in FIG. 9, the symbol is represented as b5b4b3b2b1b0 where bit error rates of the b0 and the b3 are the same, bit error rates of the b1 and the b4 are the same, and bit error rates of the b2 and the b5 are the same. In this case, the to-be-transmitted bits are graded into three levels, where one level is mapped to the b0 and the b3 of the symbol, one level is mapped to the b1 and the b4 of the symbol, and the remaining one level is mapped to the b2 and the b5 of the symbol. In this case, data volumes of the three levels of bits are the same.

Step 302: Encode a plurality of levels of bits obtained through grading.

To implement subsequent staggered mapping, before the plurality of levels of bits obtained through grading are formally encoded, precoding may be further performed. To be specific, bits at any two levels in the three levels of bits may be precoded to obtain two precoded codewords. Lengths of the two precoded codewords are different, and are both less than a length of a remaining codeword in third levels of codewords, so that codewords at different levels are staggered.

As shown in FIG. 9, code1-level bits and code2-level bits may be precoded, for example, all are encoded into is, to obtain a code1-level precode and a code2-level precode, where lengths of the two precodes are different, and are both less than a length of a remaining codeword in three levels of codewords, so that codewords at the three levels are staggered. Alternatively, the code1-level bits and code3-level bits may be precoded. Alternatively, the code2-level bits and the code3-level bits may be precoded. This is not limited in this application.

With reference to FIG. 9 and FIG. 10, three levels of codewords obtained by encoding the bits obtained through grading are code1-level codewords, code2-level codewords, and code3-level codewords. Codewords at each level include a plurality of codewords. The code1-level codewords include a code1-1, a code1-2, a code1-3, . . . , a code1-6, a code1-7, a code1-8, . . . . The code2-level codewords include a code2-1, a code2-2, a code2-3, . . . , a code2-7, a code2-8, . . . . The code3-level codewords include a code3-1, a code3-2, . . . , a code3-7, a code3-8, a code3-9, . . . . The code1-level codewords are subsequently mapped to the b0 and the b3 of the 64QAM, the code2-level codewords are subsequently mapped to the b1 and the b4 of the 64QAM, and the code3-level codewords are subsequently mapped to the b2 and the b5 of the 64QAM.

Step 303: Map the plurality of levels of codewords to a symbol in a staggered manner.

The plurality of levels of codewords include a first codeword. The first codeword is located at a $Y^{th}$ level of the plurality of levels of codewords. The first codeword overlaps at least one codeword at any level other than the $Y^{th}$ level. Y is an integer greater than or equal to 1.

The plurality of levels of codewords may be mapped, in a mapping manner of Ungerboeck partitioning, to the symbol in a staggered manner. After the plurality of levels of codewords are mapped to the symbol in a staggered manner, a symbol obtained through mapping may be sent to another communication device.

The demodulation and decoding method provided in embodiments of this application is described below by using an example of decoding a symbol obtained through 64QAM modulation. Refer to FIG. 10.

Step 401: Directly demodulate a first part of a first codeword.

The first codeword includes the first part and a second part.

In the solution shown in this embodiment of this application, the first part may be a part, of the first codeword, that is newly received by the communication device, and the part may be the last part of the first codeword.

For example, as shown in FIG. 10, a newly arriving code block includes a part C of a code1-8, a part A of a code2-9, and a part B of a code3-9. The code1-8 is the first codeword, the part C of the code1-8 is the first part of the first codeword, and parts A and B of the code1-8 are the second part of the first codeword. After the part C of the code1-8 is received, the part C of the code1-8 may be directly demodulated.

Step 402: Perform assisted demodulation on the second part of the first codeword based on decoded information of an overlapping part of at least one second codeword.

The first codeword overlaps the second codeword. The overlapping part of the second codeword and a bit of the second part of the first codeword are mapped to different bits of one symbol. The assisted demodulation means demodulating, by using the decoded information of the overlapping part as priori information, a part that overlaps the overlapping part, so that demodulation and decoding performance can be improved.

For example, as shown in FIG. 10, a quantity of second codewords is 2, and the second codewords are a code2-8 and a code3-8. Both the code2-8 and the code3-8 overlap the code1-8. There are also two overlapping parts of the second codewords. A first overlapping part is parts B and C of the code2-8, and a second overlapping part is a part C of the code3-8. The parts B and C of the code2-8 overlap all bits of the second part (namely, the parts A and B) of the code1-8. The part C of the code3-8 overlaps some bits (namely, the part A) of the second part of the code1-8.

In this embodiment, decoded information of the part C of the code2-8 is used to assist in demodulating the part B of the code1-8, and decoded information of the part B of the code2-8 and the part C of the code3-8 is used to assist in demodulating the part A of the code1-8.

Step 403: Decode a first codeword obtained through the direct demodulation and the assisted demodulation.

After demodulation of the code-8 is completed, a demodulated code1-8 may be decoded.

After decoding is completed, decoded information of the code1-8 may be directly output. Alternatively, to improve decoding performance, convolutional demodulation and decoding may be alternatively used, and output is performed. To be specific, in a decoding window and according to a forward order, for any codeword, a demapping unit performs assisted demodulation on the codeword based on decoded information of a codeword part that overlaps the codeword. A decoder decodes a demodulated codeword and updates decoded information of the codeword. In addition, the decoder outputs decoded information of a target codeword in the decoding window. The forward order is opposite to a codeword receiving order. The target codeword is the $1^{st}$ codeword received in the decoding window.

For example, as shown in FIG. 10, a convolutional decoding window is 8. The convolutional decoding window being 8 means that, in a decoding window including eight code blocks (for example, the part C of the code1-8, the part A of the code2-9, and the part B of the code3-9 constitute a code block), convolutional decoding is performed in a forward order and/or a backward order. A code3-7 is a target codeword in the decoding window, and is the $1^{st}$ codeword received in the decoding window.

The following first describes forward decoding.

Decoded information of the part B of the code1-8 is used to assist in demodulating the part C of the code2-8. Decoded information of the part A of the code1-8 and a part C of a code1-7, and decoded information of a part B and the part C of the code3-8 are used to assist in demodulating a part A and the part C of the code2-8. A demodulated code2-8 is decoded.

Decoded information of a part B and the part C of the code1-7 and the part A of the code1-8, and decoded information of a part C of a code2-7 and the part A and the part B of the code2-8 are used to assist in demodulating a part A, the part B, and the part C of the code3-8. A demodulated code3-8 is decoded.

Decoded information of the part A and the part B of the code3-8, decoded information of a part C of the code3-7, decoded information of the part A of the code2-8, and decoded information of a part B and the part C of the code2-7 are used to assist in demodulating a part A, the part B, and the part C of the code1-7. A demodulated code1-7 is decoded.

Decoded information of the part A of the code3-8, decoded information of a part B and the part C of the code3-7, decoded information of the part A and the part B of the code1-7, and decoded information of a part C of a code1-6 are used to assist in demodulating a part A, the part B, and the part C of the code2-7. A demodulated code2-7 is decoded.

Decoded information of the part A and the part B of the code2-7, decoded information of a part C of a code2-6, decoded information of a part B and the part C of the code1-6, and decoded information of the part A of the code1-7 are used to assist in demodulating a part A, the part B, and the part C of the code3-7. A demodulated code3-7 is decoded, and decoded information of the code3-7 is output. That is, the code3-7 is the target codeword in the decoding window, and the code3-7 is the $1^{st}$ complete codeword received in the decoding window.

In another possible implementation, a forward and backward convolutional demodulation and decoding manner may be alternatively used, and forward demodulation and decoding is combined with backward demodulation and decoding to improve decoding performance. For example, as shown in FIG. 10, a convolutional decoding window is 8.

First, backward demodulation and decoding is performed. To be specific, in a decoding window and according to a backward order, for any codeword, a demapping unit performs assisted demodulation on the codeword based on decoded information of a codeword part that overlaps the codeword. A decoder decodes a demodulated codeword and updates decoded information of the codeword. The backward order is the same as a codeword receiving order:

Decoded information of a part A and a part B of a code2-7, decoded information of a part C of a code2-6, decoded information of a part B and a part C of a code1-6, and decoded information of a part A of a code1-7 are used to assist in demodulating a part A, a part B, and a part C of the code3-7. A demodulated code3-7 is decoded.

Decoded information of the part B and the part C of the code3-7, decoded information of a part A of the code3-8, decoded information of the part C of the code1-6, and decoded information of the part A and a part C of the code1-7 are used to assist in demodulating the part A, the part B, and a part C of the code2-7. A demodulated code2-7 is decoded.

Decoded information of the part C of the code2-7, decoded information of the part A and a part B of the code3-8, decoded information of the part B and the part C of the code2-7, and decoded information of a part A of the code2-8 are used to assist in demodulating the part A, a part B, and the part C of the code1-7. A demodulated code1-7 is decoded.

Decoded information of the part B and the part C of the code1-7, decoded information of the part A of the code1-8, decoded information of the part C of the code2-7, and decoded information of the part A and the part B of the code2-8 are used to assist in demodulating the part A, the part B, and the part C of the code3-8. A demodulated code3-8 is decoded.

Decoded information of the part B of the code1-8 is used to assist in demodulating the part C of the code2-8. Decoded information of the part A of the code1-8 and the part C of the code1-7, and decoded information of the part B and the part C of the code3-8 are used to assist in demodulating the part A and the part C of the code2-8. A demodulated code2-8 is decoded.

Decoded information of the part C of the code3-8, and decoded information of the part B of the code2-8 are used to assist in demodulating the part A of the code1-8. Decoded information of the part C of the code2-8 is used to assist in demodulating the part B of the code1-8, and the part C of the code1-8 is directly demodulated. A demodulated code1-8 is decoded. It should be noted that, in this case, decoded information of the code1-8 may be directly output; or subsequent forward demodulation and decoding may be further performed, and decoded information of a target codeword is output.

Forward demodulation and decoding is performed. To be specific, in the decoding window and according to a forward order, for any codeword, the demapping unit performs assisted demodulation on the codeword based on decoded information of a codeword part that overlaps the codeword. Then, the decoder decodes a demodulated codeword and updates decoded information of the codeword. In addition, the decoder outputs decoded information of a target codeword in the decoding window:

Decoded information of the part B of the code1-8 is used to assist in demodulating the part C of the code2-8. Decoded information of the part A of the code1-8 and a part C of a code-7, and decoded information of a part B and the part C of the code3-8 are used to assist in demodulating a part A and the part C of the code2-8. A demodulated code2-8 is decoded.

Decoded information of a part B and the part C of the code1-7 and the part A of the code1-8, and decoded information of a part C of a code2-7 and the part A and the part B of the code2-8 are used to assist in demodulating a part A, the part B, and the part C of the code3-8. A demodulated code3-8 is decoded.

Decoded information of the part A and the part B of the code3-8, decoded information of a part C of the code3-7, decoded information of the part A of the code2-8, and decoded information of a part B and the part C of the code2-7 are used to assist in demodulating a part A, a part B, and the part C of the code1-7. A demodulated code1-7 is decoded.

Decoded information of the part A of the code3-8, decoded information of a part B and the part C of the code3-7, decoded information of a part A and a part B of the code1-7, and decoded information of a part C of a code1-6 are used to assist in demodulating a part A, a part B, and the part C of the code2-7. A demodulated code2-7 is decoded.

Decoded information of the part A and the part B of the code2-7, decoded information of a part C of a code2-6, decoded information of a part B and the part C of the code1-6, and decoded information of the part A of the code1-7 are used to assist in demodulating a part A, the part B, and the part C of the code3-7. A demodulated code3-7 is decoded, and decoded information of the code3-7 is output.

In addition, a plurality of iterations may be alternatively performed in a manner of a plurality of times of forward demodulation and decoding and a plurality of times of backward demodulation and decoding, to further improve decoding performance.

Based on a technical concept same as that of the modulation and encoding method, an embodiment of this application further provides a modulation and encoding apparatus. With reference to FIG. 1, the apparatus includes:

a grading unit 101, configured to grade to-be-transmitted bits into a plurality of levels;

an encoder (including an encoder iota and an encoder 102b), configured to encode a plurality of levels of bits obtained through grading to obtain a plurality of levels of codewords; and a mapping unit 103, configured to map the plurality of levels of codewords to a symbol in a staggered manner, where the plurality of levels of codewords include a first codeword, the first codeword is located at a $Y^{th}$ level of the plurality of levels of codewords, the first codeword overlaps at least one codeword at any level other than the $Y^{th}$ level, and Y is an integer greater than or equal to 1.

In a possible implementation, the first codeword includes M1 bits, the at least one codeword at any level other than the $Y^{th}$ level includes M2 bits, and the overlapping means: N bits of the first codeword and N bits of the at least one codeword are respectively mapped to different bits of one symbol, where M1, M2 and N are all positive integers, N<M1, and N<M2.

In a possible implementation, when the first codeword is not the $1^{st}$ codeword and is not the last codeword, the first codeword overlaps two consecutive codewords at any level other than the $Y^{th}$ level.

In a possible implementation, the N bits of the first codeword include at least a first part and a second part, the first part overlaps some bits of a codeword at a $Z^{th}$ level, the second part overlaps some bits of another codeword at the $Z^{th}$ level, Z is an integer greater than or equal to 1, and Z is not equal to Y.

In a possible implementation, the N bits of the first codeword include at least a first part and a second part, and the first part overlaps at least one codeword at each level other than the $Y^{th}$ level, and/or the second part overlaps at least one codeword at each level other than the $Y^{th}$ level.

In a possible implementation, the plurality of levels of bits are X levels of bits, X is an integer greater than 1, and before encoding the plurality of levels of bits obtained through grading, the encoder is further configured to: precode any X−1 levels of bits in the X levels of bits to obtain X−1 precoded codewords, where the X−1 precoded codewords are the $1^{st}$ codewords corresponding to the X−1 levels of bits respectively, and lengths of the precoded codewords are different and each are less than a total length of a codeword at a corresponding level.

In a possible implementation, when encoding the plurality of levels of bits obtained through grading, the encoder is configured to: encode, by using codewords with different error correction performance, the plurality of levels of bits obtained through grading, where a codeword with higher error correction performance is used for a bit at a level corresponding to a higher bit error rate.

In a possible implementation, the apparatus further includes a probability adapter, configured to: perform probability adaptation and shaping on unencoded bits.

In a possible implementation, the mapping unit 103 is configured to: map, in a mapping manner of Ungerboeck partitioning, the plurality of levels of codewords to the symbol in a staggered manner.

Based on a technical concept same as that of the demodulation and decoding method, an embodiment of this application further provides a demodulation and decoding apparatus. With reference to FIG. 2, the apparatus includes:

a demapping unit 201, configured to directly demodulate a first part of a first codeword, where the first codeword includes the first part and a second part, where the demapping unit 201 is further configured to perform assisted demodulation on the second part of the first codeword based on decoded information of an overlapping part of at least one second codeword; and a decoder (including a decoder 202a and a decoder 202b), configured to decode a first codeword obtained through the direct demodulation and the assisted demodulation, where the first codeword overlaps the second codeword, and the overlapping part of the second codeword and a bit of the second part of the first codeword are mapped to different bits of one symbol.

In a possible implementation, a symbol corresponding to the first codeword and the second codeword is obtained by mapping X levels of codewords in a staggered manner, X is an integer greater than 1, and the demapping unit 201 is configured to: perform assisted demodulation on the second part of the first codeword based on decoded information of an overlapping part of X−1 second codewords, where the X−1 second codewords respectively belong to different levels.

In a possible implementation, the second part of the first codeword includes a plurality of subparts, and all bits of an overlapping part of each second codeword overlap all bits of at least one subpart; and the demapping unit 201 is configured to: for each subpart of the second part of the first codeword, determine a target part, of each second codeword, that overlaps any one of each subpart, and perform assisted demodulation on each subpart based on decoded information of the target part, where the target part is all bits or some bits of an overlapping part of each second codeword, and all bits of the target part overlap all bits of the corresponding subpart.

In a possible implementation, the second part of the first codeword includes a first subpart and a second subpart, and the second subpart is located between the first subpart and the first part of the first codeword;

the quantity of second codewords is 2, all bits of an overlapping part of one of the two second codewords overlap all bits of the first subpart, an overlapping part of the other second codeword includes a first target part and a second target part, all bits of the first target part overlap all bits of the first subpart, and all bits of the second target part overlap all bits of the second subpart; and the demapping unit 201 is configured to:

perform assisted demodulation on the first subpart based on decoded information of the overlapping part, of one second codeword, that overlaps the first subpart, and decoded information of the first target part of the other second codeword; and perform assisted demodulation on the second subpart based on decoded information of the second target part, of the other second codeword, that overlaps the second subpart.

In a possible implementation, the decoder is further configured to: output decoded information of the first codeword.

In a possible implementation, the demapping unit 201 is further configured to:

in a decoding window and according to a forward order, for any codeword, perform assisted demodulation on the codeword based on decoded information of a codeword part that overlaps the any codeword; and the decoder is further configured to:

decode a demodulated codeword and update decoded information of the codeword; and output decoded information of a target codeword in the decoding window, where the forward order is opposite to a codeword receiving order, and the target codeword is the $1^{st}$ codeword received in the decoding window.

In a possible implementation, the demapping unit 201 is further configured to:

in the decoding window and according to a backward order, for any codeword, perform assisted demodulation on the codeword based on decoded information of a codeword part that overlaps the any codeword; and the decoder is further configured to:

decode a demodulated codeword and update decoded information of the codeword, where the backward order is the same as the codeword receiving order.

With reference to FIG. 11, an embodiment of this application provides a communication device 1100. The communication device 1100 includes at least one processor 1101, a bus system 1102, a memory 1103, and a communication interface 1104.

The processor 1101 may be a general-purpose central processing unit (CPU), a network processor (NP), a graphics processing unit, a microprocessor, an application-specific integrated circuit (ASIC), or one or more integrated circuits configured to control execution of programs of solutions of this application.

The bus system 1102 may include a channel for transmitting information between the foregoing components.

The memory 1103 may be a read-only memory (ROM) or another type of static storage device that can store static information and instructions, or a random access memory (RAM) or another type of dynamic storage device that can store information and instructions, or may be an electrically erasable programmable read-only memory (EEPROM), a compact disc read-only memory (CD-ROM) or another optical disk storage, an optical disc storage (including a compact disc, a laser disc, an optical disc, a digital versatile disc, a Blu-ray disc, or the like), a disk storage medium or another magnetic storage device, or any other medium that can be used to carry or store expected program code in a form of instructions or a data structure and that can be accessed by a computer. However, the memory 1103 is not limited thereto. The memory may exist independently, and is connected to the processor by using the bus. Alternatively, the memory may be integrated with the processor.

The memory 1103 is configured to store application program code for performing solutions of this application, and the processor 1101 controls execution of the application program code. The processor 1101 is configured to execute the application program code stored in the memory 1103, to implement the modulation and encoding method provided in the foregoing embodiments of this application. The communication interface 1104 is configured to send or receive a message, for example, configured to send a symbol obtained through modulation and encoding.

During specific implementation, in an embodiment, the processor 1101 may include one or more CPUs.

Figure 12:
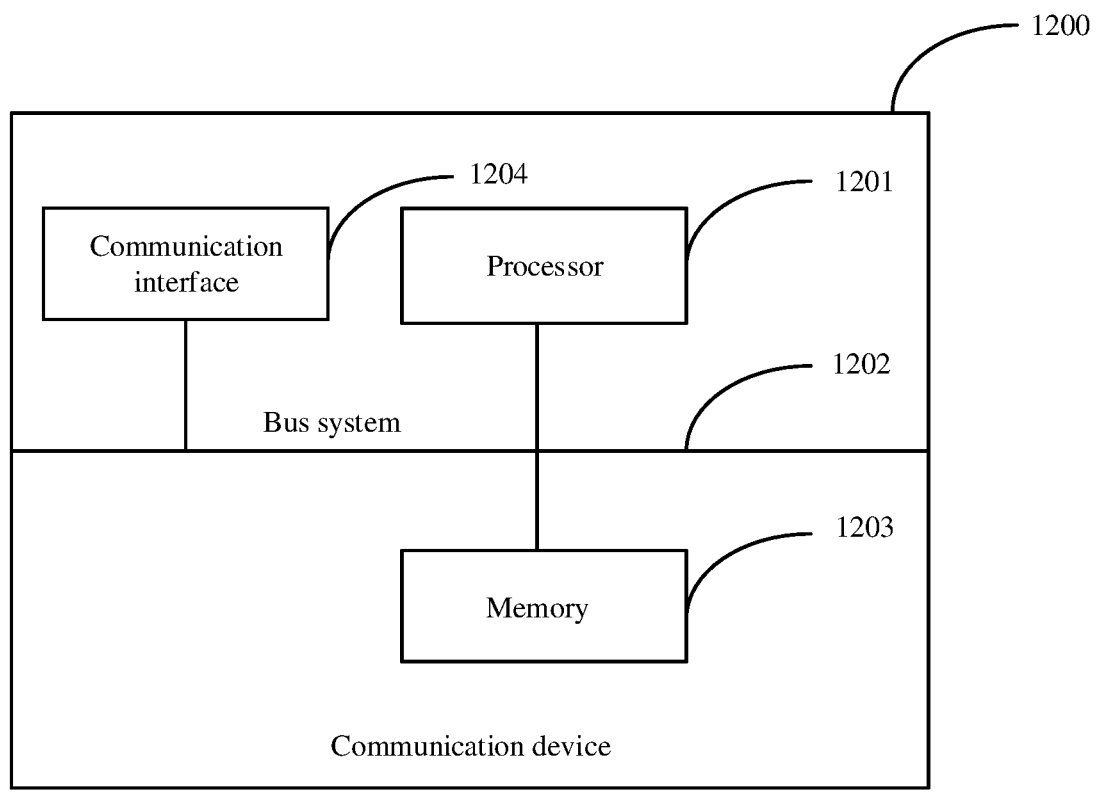
FIG. 12 is a schematic diagram of a structure of a communication device according to an embodiment of this application.

With reference to FIG. 12, an embodiment of this application provides a communication device 1200. The communication device 1200 includes at least one processor 1201, a bus system 1202, a memory 1203, and a communication interface 1204.

The processor 1201 may be a general-purpose central processing unit (CPU), a network processor (NP), a graphics processing unit, a microprocessor, an application-specific integrated circuit (ASIC), or one or more integrated circuits configured to control execution of programs of solutions of this application.

The bus system 1202 may include a channel for transmitting information between the foregoing components.

The memory 1203 may be a read-only memory (ROM) or another type of static storage device that can store static information and instructions, or a random access memory (RAM) or another type of dynamic storage device that can store information and instructions, or may be an electrically erasable programmable read-only memory (EEPROM), a compact disc read-only memory (CD-ROM) or another optical disk storage, an optical disc storage (including a compact disc, a laser disc, an optical disc, a digital versatile disc, a Blu-ray disc, or the like), a disk storage medium or another magnetic storage device, or any other medium that can be used to carry or store expected program code in a form of instructions or a data structure and that can be accessed by a computer. However, the memory 1203 is not limited thereto. The memory may exist independently, and is connected to the processor by using the bus. Alternatively, the memory may be integrated with the processor.

The memory 1203 is configured to store application program code for performing solutions of this application, and the processor 1201 controls execution of the application program code. The processor 1201 is configured to execute the application program code stored in the memory 1203, to implement the demodulation and decoding method provided in the foregoing embodiments of this application. The communication interface 1204 is configured to send or receive a message, for example, configured to receive a symbol sent by another communication device.

During specific implementation, in an embodiment, the processor 1201 may include one or more CPUs.

An embodiment of this application further provides a communication system. The communication system includes the communication device 1100 for performing the modulation and encoding method provided in embodiments of this application, and/or the communication device 1200 for performing the demodulation and decoding method provided in embodiments of this application.

All or some of the foregoing embodiments may be implemented by using software, hardware, firmware, or any combination thereof. When the software is used for implementation, all or some of the embodiments may be implemented in a form of a computer program product. The computer program product includes one or more computer instructions. When the computer instructions are loaded and executed on a device, all or some of the processes or functions according to embodiments of this application are generated. The computer instructions may be stored in a computer-readable storage medium. The computer-readable storage medium may be any usable medium accessible to a device, or a data storage device integrating one or more usable media. The usable medium may be a magnetic medium (for example, a floppy disk, a hard disk, or a magnetic tape), an optical medium (for example, a digital video disk (DVD)), a semiconductor medium (for example, a solid-state drive).

A person of ordinary skill in the art may understand that all or some of the steps of the foregoing embodiments may be implemented by hardware or a program instructing related hardware. The program may be stored in a computer-readable storage medium. The storage medium may be a read-only memory, a magnetic disk, a compact disc, or the like.

The foregoing descriptions are merely optional embodiments of this application, but are not intended to limit this application. Any modification, equivalent replacement, or improvement made without departing from the spirit and principle of this application should fall within the protection scope of this application.

What is claimed is:

1. A method comprising:
   grading to-be-transmitted bits into a plurality of levels to generate bits of the plurality of levels;
   encoding the bits of the plurality of levels to obtain codewords of the plurality of levels; and
   mapping the codewords of the plurality of levels to a symbol in a staggered manner, wherein
   the codewords of the plurality of levels comprise a first codeword, the first codeword is at a $Y^{th}$ level of the plurality of levels, the first codeword partially overlaps at least one codeword at a level other than the $Y^{th}$ level, and Y is an integer greater than or equal to 1; and
   wherein the first codeword comprises M1 bits, the at least one codeword at the level other than the $Y^{th}$ level comprises M2 bits, and the first codeword partially overlapping the at least one codeword comprises:
   N bits of the first codeword and N bits of the at least one codeword at the level other than the $Y^{th}$ level are respectively mapped to different bits of the symbol in an overlapping manner, bits of the first codeword and the at least one codeword at the level other than the $Y^{th}$ level that are other than the N bits of the first codeword and the N bits of the at least one codeword at the level other than the $Y^{th}$ level do not overlap, wherein M1, M2, and N are positive integers, N<M1, and N<M2.

2. The method according to claim 1, wherein the first codeword is not a starting codeword at the $Y^{th}$ level and is not a last codeword at the $Y^{th}$ level, and the first codeword overlaps two consecutive codewords at the level other than the $Y^{th}$ level.

3. The method according to claim 2, wherein the N bits of the first codeword comprise at least a first part and a second part, the first part overlaps some bits of a codeword at a $Z^{th}$ level, the second part overlaps some bits of another codeword at the $Z^{th}$ level, Z is an integer greater than or equal to 1, and Z is different than Y.

4. The method according to claim 1, wherein the N bits of the first codeword comprise at least a first part and a second part, and the first part overlaps at least one codeword at each level of the plurality of levels other than the $Y^{th}$ level, or the second part overlaps at least one codeword at each level of the plurality of levels other than the $Y^{th}$ level.

5. The method according to claim 1, wherein the plurality of levels are X levels, X is an integer greater than 1, and before encoding the bits of the plurality of levels, the method further comprises:
   precoding bits of X−1 levels of the X levels to obtain X−1 precoded codewords, wherein the X−1 precoded codewords are starting codewords corresponding to the bits of the X−1 levels respectively, and lengths of the X−1 precoded codewords are different and each is less than a length of a codeword at a corresponding level.

6. The method according to claim 1, wherein encoding the bits of the plurality of levels comprises:
   encoding, using codewords with different error correction performance, the bits of the plurality of levels, wherein a codeword with higher error correction performance is used for encoding a bit at a level with a higher bit error rate.

7. A method comprising:
directly demodulating a first part of a first codeword to generate a first demodulated codeword, wherein the first codeword comprises the first part and a second part;
performing assisted demodulation on the second part of the first codeword based on decoded information of a part of at least one second codeword, to generate a second demodulated codeword, the first codeword overlapping the at least one second codeword, and the part of the at least one second codeword and a bit of the second part of the first codeword being mapped to different bits of a symbol; and
decoding the first demodulated codeword and the second demodulated codeword.

8. The method according to claim 7, wherein the symbol corresponding to the first codeword and the at least one second codeword is obtained by mapping codewords of X levels to the symbol in a staggered manner, X is an integer greater than 1, and performing the assisted demodulation on the second part of the first codeword comprises:
performing the assisted demodulation on the second part of the first codeword based on decoded information of a part of X−1 second codewords of the at least one second codeword, wherein
the X−1 second codewords respectively belong to different levels, the part of the X−1 second codewords overlapping the second part of the first codeword.

9. The method according to claim 8, wherein the second part of the first codeword comprises a plurality of subparts, and all bits of an overlapping part of each second codeword of the at least one second codeword overlap all bits of at least one subpart of the plurality of subparts; and
performing the assisted demodulation on the second part of the first codeword comprises:
determining a target part, of each second codeword, that overlaps a subpart of the plurality of subparts, and performing the assisted demodulation on the subpart based on decoded information of the target part, wherein
the target part is all bits or some bits of an overlapping part of each second codeword, and all bits of the target part overlap all bits of the subpart.

10. An apparatus comprising:
a non-transitory memory storage comprising instructions; and
one or more processors in communication with the memory storage, wherein the instructions, when executed by the one or more processors, cause the apparatus to:
grade to-be-transmitted bits into a plurality of levels to generate bits of the plurality of levels;
encode the bits of the plurality of levels to obtain codewords of the plurality of levels; and
map the codewords of the plurality of levels to a symbol in a staggered manner, wherein
the codewords of the plurality of levels comprise a first codeword, the first codeword is at a $Y^{th}$ level of the plurality of levels, the first codeword partially overlaps at least one codeword at a level other than the $Y^{th}$ level, and Y is an integer greater than or equal to 1; and
the first codeword comprises M1 bits, the at least one codeword at the level other than the $Y^{th}$ level comprises M2 bits, and the first codeword partially overlapping the at least one codeword comprises:
N bits of the first codeword and N bits of the at least one codeword at the level other than the $Y^{th}$ level are respectively mapped to different bits of the symbol in an overlapping manner, bits of the first codeword and the at least one codeword at the level other than the $Y^{th}$ level that are other than the N bits of the first codeword and the N bits of the at least one codeword at the level other than the $Y^{th}$ level do not overlap, wherein M1, M2, and N are positive integers, N<M1, and N<M2.

11. The apparatus according to claim 10, wherein the first codeword is not a starting codeword at the $Y^{th}$ level and is not a last codeword at the $Y^{th}$ level, the first codeword overlaps two consecutive codewords at the level other than the $Y^{th}$ level.

12. The apparatus according to claim 11, wherein the N bits of the first codeword comprise at least a first part and a second part, the first part overlaps some bits of a codeword at a $Z^{th}$ level, the second part overlaps some bits of another codeword at the $Z^{th}$ level, Z is an integer greater than or equal to 1, and Z is different than Y.

13. The apparatus according to claim 10, wherein the N bits of the first codeword comprise at least a first part and a second part, and the first part overlaps at least one codeword at each level of the plurality of levels other than the $Y^{th}$ level, or the second part overlaps at least one codeword at each level of the plurality of levels other than the $Y^{th}$ level.

14. The apparatus according to claim 10, wherein the plurality of levels are X levels, X is an integer greater than 1, and before encoding the bits of the plurality of levels, the apparatus is further caused to:
precode bits of X−1 levels in the X levels to obtain X−1 precoded codewords, wherein
the X−1 precoded codewords are starting codewords corresponding to the bits of the X−1 levels respectively, and lengths of the X−1 precoded codewords are different and each is less than a length of a codeword at a corresponding level.

15. The apparatus according to claim 10, wherein encoding the bits of the plurality of levels comprises:
encoding, using codewords with different error correction performance, the bits of the plurality of levels, wherein a codeword with higher error correction performance is used for encoding a bit at a level corresponding to a higher bit error rate.

16. An apparatus comprising:
a non-transitory memory storage comprising instructions; and
one or more processors in communication with the memory storage, wherein the instructions, when executed by the one or more processors, cause the apparatus to:
directly demodulate a first part of a first codeword, to generate a first demodulated codeword, wherein the first codeword comprises the first part and a second part;
perform assisted demodulation on the second part of the first codeword based on decoded information of a part of at least one second codeword, to generate a second demodulated codeword, the first codeword overlapping the at least one second codeword, and the part of the at least one second codeword and a bit of the second part of the first codeword being mapped to different bits of a symbol; and
decode the first demodulated codeword and the second demodulated codeword.

17. The apparatus according to claim 16, wherein a symbol corresponding to the first codeword and the at least one second codeword is obtained by mapping codewords of X levels to the symbol in a staggered manner, X is an integer greater than 1, and performing the assisted demodulation on the second part of the first codeword comprises:

Performing the assisted demodulation on the second part of the first codeword based on decoded information of a part of X−1 second codewords of the at least one second codeword, wherein the X−1 second codewords respectively belong to different levels, the part of the X−1 second codewords overlapping the second part of the first codeword.

18. The apparatus according to claim 17, wherein the second part of the first codeword comprises a plurality of subparts, all bits of an overlapping part of each second codeword of the at least one second codeword overlap all bits of at least one subpart of the plurality of subparts, and the apparatus is further caused to:

determine a target part, of each second codeword, that overlaps a subpart of the plurality of subparts, and perform the assisted demodulation on the subpart based on decoded information of the target part, wherein the target part is all bits or some bits of an overlapping part of each second codeword, and all bits of the target part overlap all bits of the subpart.

* * * * *